(12) United States Patent
Tsuchiya et al.

(10) Patent No.: US 7,763,946 B2
(45) Date of Patent: Jul. 27, 2010

(54) SEMICONDUCTOR DEVICE AND METHOD FOR MANUFACTURING THE SAME

(75) Inventors: Yoshinori Tsuchiya, Yokohama (JP); Masato Koyama, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 11/871,570

(22) Filed: Oct. 12, 2007

(65) Prior Publication Data

US 2008/0211034 A1 Sep. 4, 2008

(30) Foreign Application Priority Data

Mar. 2, 2007 (JP) ............... 2007-052493

(51) Int. Cl.
*H01L 27/092* (2006.01)
(52) U.S. Cl. ............... 257/371; 257/388; 257/412; 257/E27.067; 438/223
(58) Field of Classification Search ............. 257/49–52, 257/E51.005, 384, 371, 388, 412, E27.067, 257/E21.632, E29.151; 438/223
See application file for complete search history.

(56) References Cited

U.S. PATENT DOCUMENTS

2005/0045965 A1* 3/2005 Lin et al. .................. 257/384
2007/0210351 A1 9/2007 Tsuchiya et al.

OTHER PUBLICATIONS

U.S. Appl. No. 11/907,353, filed Oct. 11, 2007, Unknown.
U.S. Appl. No. 12/133,583, filed Jun. 5, 2008, Koyama, et al.
U.S. Appl. No. 11/687,834, filed Mar. 19, 2007, Yoshinori Tsuchiya, et al.
A. Lauwers, et al., "CMOS Integration of Dual Work Function Phase Controlled Ni FUSI with Simultaneous Silicidation of NMOS (NiSi) and PMOS (Ni-rich silicide) Gates on HfSiON", International Electron Devices Meeting, Tech, Digest, 2005, 4 pages.
A. Veloso, et al., "Dual work function phase controlled Ni-FUSI CMOS (NiSi NMOS, $Ni_2Si$ or $Ni_{31}Si_{12}$ PMOS): Manufacturability, Reliability & Process Window Improvement by Sacrificial SiGe cap", Symposium on VLSI Technology Digest of Technical Papers, 2006, 2 pages.
Yoshinori Tsuchiya, et al., "Practical Work Function Tuning Based on Physical and Chemical Nature of Interfacial Impurity in Ni-FUSI/SiON and HfSiON Systems", International Electron Devices Meeting, Dec. 11-13, 2006, pp. 231-234 and cover sheet.

* cited by examiner

*Primary Examiner*—Thinh T Nguyen
(74) *Attorney, Agent, or Firm*—Oblon, Spivak, McClelland, Maier & Neustadt, L.L.P.

(57) ABSTRACT

A semiconductor device includes: a substrate and a p-channel MIS transistor. The p-channel MIS transistor includes: an n-type semiconductor region formed in the substrate; p-type first source and drain regions formed at a distance from each other in the n-type semiconductor region; a first gate insulating film formed on the n-type semiconductor region between the first source region and the first drain region; and a first gate electrode formed on the first gate insulating film. The first gate electrode includes a first nickel silicide layer having a Ni/Si composition ratio of 1 or greater, and a silicide layer formed on the first nickel silicide layer. The silicide layer contains a metal having a larger absolute value of oxide formation energy than that of Si, and a composition ratio of the metal to Si is smaller than the Ni/Si composition ratio.

13 Claims, 18 Drawing Sheets

| METAL ELEMENT | ABSOLUTE VALUE OF OXIDE FORMATION ENERGY (kcal) | SI CONSUMPTION RATE IN SILICIDE FORMATION (METAL FILM THICKNESS = 1) | SPECIFIC RESISTANCE ($\mu\Omega\cdot$cm) |
|---|---|---|---|
| Ti | 944.0 | 2.2 | $TiSi_2$:13-18 |
| Zr | 1100.6 | 1.7 | $ZrSi_2$:35-106.2 |
| Hf | 1144.7 | 1.7 | $HfSi_2$:45-62 |
| Si | 910.7 | - | - |

FIG. 7

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2007-52493 filed on Mar. 2, 2007 in Japan, the entire contents of which are incorporated herein by reference.

BACKGROUND OF THE INVENTION

1. Field of the Invention

The present invention relates to a semiconductor device having MIS transistors and a method for manufacturing the semiconductor device.

2. Description of the Related Art

"Silicon large-scale integrated circuit" is one of the fundamental device technologies that will support the advanced information society in the future. To achieve high performances from integrated circuits, it is necessary to produce highly sophisticated semiconductor elements such as MISFETs (Metal-Insulator-Semiconductor Field Effect Transistors) and CMISFETs (Complementary MISFETs) that serve as the components of the integrated circuits. Conventionally, the sophistication of devices has been achieved by the scaling rule. In recent years, however, it is difficult to achieve high performances by making devices smaller, due to various physical limitations.

For example, with gate electrodes formed with silicon, there have been problems that the gate parasitic resistance becomes higher as the device operation speed increases, the effective insulating film capacity becomes smaller due to carrier depletion caused at the interface with each insulating film, and the threshold voltage varies due to penetration of impurities into the channel region. To solve such problems, the use of metal gate materials has been suggested.

One of the metal gate electrode forming techniques is the full-silicidation gate electrode technique by which an entire gate electrode is silicided with Ni or Co. Metal gate electrodes need to have different work functions in accordance with the conductivity types, so as to realize a device operation with an optimum operating threshold voltage.

This is because the operating threshold voltage of each MIS transistor is modulated as the work function (Φeff: effective work function) of the gate electrode varies at the interface between the gate electrode and the gate insulating film. To prepare gate electrodes having optimum work functions for the respective conductivity types, the process for manufacturing a CMISFET needs to be complicated, and the production costs become higher. Therefore, studies have been made to develop a technique for controlling the work functions of gate electrodes with ease.

For example, when a fully-silicided electrode including a nickel (Ni) silicide is produced, the composition is varied by adjusting the film thickness of the Ni film, so as to control the work function (see A. Lauwers et al., IEDM 2005 technical digest, p.p. 661-664 and A. Veloso, et al., VLSI-sympo. 2006 technical digest, p.p. 116-117, for example).

However, to form Ni films of different film thicknesses for the conductivity types and control the Ni—Si composition, a procedure for protecting one of the electrodes with a hard mask such as a silicon nitride film needs to be carried out twice, which complicates the manufacturing process. In A. Lauwers et al., IEDM 2005 technical digest, p.p. 661-664, the Ni—Si composition is controlled in accordance with the conductivity type by simply reducing the height of the polycrystalline Si gate electrode of the pMIS by reactive ion etching.

In A. Veloso, et al., VLSI-sympo. 2006 technical digest, p.p. 116-117, a polycrystalline SiGe layer is formed on a polycrystalline Si layer, and the selectivity in solution etching with Si is utilized to control the gate height of the polycrystalline Si layer. In this manner, the Ni—Si composition is controlled, and the work function of each electrode is adjusted in accordance with the conductivity type.

By the technique for reducing the height of each polycrystalline Si layer, however, in a case where the height is reduced to a half of the original height or less, film thickness control needs to be performed within 5 nm, and the production variation in the plane of the Si substrate becomes larger. As a result, the yield of the devices as LSI circuits becomes lower. In a case where a Ni silicide having a larger Ni/Si composition ratio than 1 is formed in a p-channel MIS transistor by the above technique, the volume of the electrode increases during the formation of the Ni silicide, and mechanical stress is applied to the gate insulating film located immediately below the gate electrode. As a result, defects are formed in the gate insulating film, and the insulating properties are degraded. The mechanical stress is also applied to the channel region, and its size varies with the production variation. This increases the variation in mobility, and degrades the circuit performance.

SUMMARY OF THE INVENTION

The present invention has been made in view of these circumstances, and an object thereof is to provide a semiconductor device including MIS transistors that have a smaller variation during the manufacturing process and have appropriate threshold voltages, and a method for manufacturing such a semiconductor device.

A semiconductor device according to a first aspect of the present invention includes: a substrate; and a p-channel MIS transistor including: an n-type semiconductor region formed in the substrate; p-type first source and drain regions formed at a distance from each other in the n-type semiconductor region; a first gate insulating film formed on the n-type semiconductor region between the first source region and the first drain region; and a first gate electrode formed on the first gate insulating film, the first gate electrode including a first nickel silicide layer having a Ni/Si composition ratio of 1 or greater, and a silicide layer formed on the first nickel silicide layer, the silicide layer containing a metal having a larger absolute value of oxide formation energy than that of Si, a composition ratio of the metal to Si being smaller than the Ni/Si composition ratio.

A method for manufacturing a semiconductor device according to a second aspect of the present invention includes: forming a first insulating film on an n-type silicon substrate; forming a silicon layer on the first gate insulating film, and shaping the silicon layer and the first gate insulating film into a gate electrode; forming p-type first source and drain regions in portions of the n-type silicon substrate, the portions being located on both sides of the silicon layer; depositing a first Ni film on the first source and drain regions and the silicon layer; forming a first nickel silicide layer on each of the first source and drain regions, and forming a second nickel silicide layer on the silicon layer by performing a first heat treatment; depositing an interlayer insulating film, and flattening the interlayer insulating film so as to expose an upper face of the second nickel silicide layer; forming a metal film and a second Ni film one by one, so as to cover the upper face of the second nickel silicide layer, the metal film containing a metal having a larger absolute value of oxide formation energy than that of Si; and by performing a second heat treatment, turning the silicon layer and the second nickel silicide layer into a gate electrode having a stacked structure consisting of a third nickel silicide layer having a larger Ni composition than the Si composition and a silicide layer of the metal formed on the third nickel silicide layer.

A method for manufacturing a semiconductor device according to a third aspect of the present invention includes: forming an n-type semiconductor region and a p-type semiconductor region in a substrate, the n-type semiconductor region and the p-type semiconductor region being isolated from each other; forming a first gate insulating film and a second gate insulating film on the n-type semiconductor region and the p-type semiconductor region, respectively; forming a silicon layer on each of the first gate insulating film and the second gate insulating film; shaping the silicon layer and the first and second gate insulating films into gate electrodes so as to form a first layer on the first insulating film and form a second layer on the second gate insulating film, the first layer being in a shape of the gate electrode and made of silicon, the second layer being in a shape of the gate electrode and made of silicon; forming p-type first source and drain regions in portions of the n-type semiconductor region, the portions being located on both sides of the first layer; forming n-type second source and drain regions in portions of the p-type semiconductor region, the portions being located on both sides of the second layer; depositing an interlayer insulating film, and flattening the interlayer insulating film so as to expose an upper face of each of the first and second layers; forming a first Ni film so as to cover the upper faces of the first and second layers; turning the first and second layers into first and second nickel silicide layers by performing a first heat treatment; covering the p-type semiconductor region including the second nickel silicide layer with an insulating film; forming a metal film and a second Ni film one by one, so as to cover the upper face of the first nickel silicide layer, the metal film containing a metal having a larger absolute value of oxide formation energy than that of Si; and by performing a second heat treatment, turning the first nickel silicide layer into a stacked structure consisting of a third nickel silicide layer having a larger Ni/Si composition ratio than 1 and a silicide layer of the metal formed on the third nickel silicide layer.

A method for manufacturing a semiconductor device according to a sixth aspect of the present invention includes: forming an n-type semiconductor region and a p-type semiconductor region in a substrate, the n-type semiconductor region and the p-type semiconductor region being isolated from each other; forming a first gate insulating film and a second gate insulating film on the n-type semiconductor region and the p-type semiconductor region, respectively; forming a silicon layer on each of the first gate insulating film and the second gate insulating film; shaping the silicon layer and the first and second gate insulating films into gate electrodes so as to form a first layer on the first insulating film and form a second layer on the second gate insulating film, the first layer being in a shape of the gate electrode and made of silicon, the second layer being in a shape of the gate electrode and made of silicon; forming p-type first source and drain regions in portions of the n-type semiconductor region, the portions being located on both sides of the first layer; forming n-type second source and drain regions in portions of the p-type semiconductor region, the portions being located on both sides of the second layer; depositing an interlayer insulating film, and flattening the interlayer insulating film so as to expose an upper face of each of the first and second layers; forming a first metal film and a first Ni film one by one, so as to cover the upper faces of the first and second layers, the first metal film containing a first metal having a larger absolute value of oxide formation energy than that of Si; by performing a first heat treatment, turning the first and second layers into third and fourth layers each having a stacked structure consisting of a first nickel silicide layer having a smaller Ni/Si composition ratio than 1 and a silicide layer of the first metal formed on the first nickel silicide layer; covering the p-type semiconductor region including the fourth layer with an insulating film; forming a second metal film and a second Ni film one by one, so as to cover the upper face of the third layer, the second metal film containing a second metal having a larger absolute value of oxide formation energy than that of Si; and by performing a second heat treatment, turning the third layer into a stacked structure consisting of a second nickel silicide layer having a larger Ni/Si composition ratio than 1 and a silicide layer of the second metal formed on the second nickel silicide layer.

A method for manufacturing a semiconductor device according to a fourth aspect of the present invention includes: forming an n-type semiconductor region and a p-type semiconductor region in a substrate, the n-type semiconductor region and the p-type semiconductor region being isolated from each other; forming a first gate insulating film and a second gate insulating film on the n-type semiconductor region and the p-type semiconductor region, respectively; forming a silicon layer on each of the first gate insulating film and the second gate insulating film; shaping the silicon layer and the first and second gate insulating films into gate electrodes so as to form a first layer on the first insulating film and form a second layer on the second gate insulating film, the first layer being in a shape of the gate electrode and made of silicon, the second layer being in a shape of the gate electrode and made of silicon; forming p-type first source and drain regions in portions of the n-type semiconductor region, the portions being located on both sides of the first layer; forming n-type second source and drain regions in portions of the p-type semiconductor region, the portions being located on both sides of the second layer; depositing a first Ni film, and forming first and second nickel silicide layers on the first and second source and drain region, and third and fourth nickel silicide layers on the first and second layers by performing a first heat treatment; depositing an interlayer insulating film, and flattening the interlayer insulating film so as to expose an upper face of each of the third and fourth nickel silicide layers; forming a metal film and a second Ni film one by one, so as to cover the upper faces of the third and fourth nickel silicide layers, the metal film containing a metal having a larger absolute value of oxide formation energy than that of Si; by performing a second heat treatment, turning the third and fourth nickel silicide layers into first and second gate electrodes each having a stacked structure consisting of a fifth nickel silicide layer having a larger Ni/Si composition ratio than 1 and a silicide layer of the metal formed on the fifth nickel silicide layer; and segregating Al at the interface between the first gate insulating film and the fifth nickel silicide layer of the first gate electrode.

BRIEF DESCRIPTION OF THE DRAWINGS

FIG. 7 shows the oxide formation energy, Si consumptions, and specific resistances of Ti, Hf, and Zr;

DESCRIPTION OF THE PREFERRED EMBODIMENTS

Figure 1:
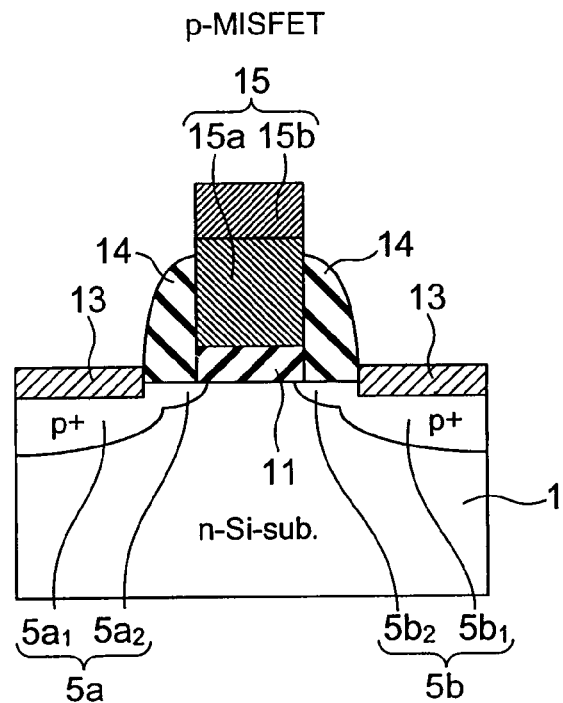
FIG. 1 is a cross-sectional view of a pMISFET according to a first embodiment, taken along the line extending in the gate length direction.

The following is a description of embodiments of the present invention, with reference to the accompanying drawings. It should be noted that the present invention is not limited to the following embodiments, and various modifications may be made to those embodiments. The accompanying drawings are schematic views designed to facilitate explanation and understanding of the invention. The shapes, sizes, and ratios shown in the drawings might be different from those of the actual devices, but they may be arbitrarily changed or modified, with the following description and the conventional techniques being taken into account.

In each of the following embodiments, MIS transistors or CMIS transistors will be described. However, the present invention may also be applied to system LSIs and memories in which logic circuits having MIS transistors integrated thereon are mounted.

First Embodiment

A p-channel MISFET in accordance with a first embodiment of the present invention is shown in FIG. 1. FIG. 1 is a cross-sectional view of the MISFET of this embodiment, taken along a line extending in the gate-length direction.

As shown in FIG. 1, the p-channel MISFET of this embodiment includes p-type source and drain regions $5a$ and $5b$ that are formed at a distance from each other on an n-type silicon substrate 1, a gate insulating film 11 that is formed on a region of the silicon substrate 1 that is located between the source region $5a$ and the drain region $5b$ and serves as the channel, and a gate electrode 15 that is formed on the gate insulating film 11. A NiSi layer 13 is formed on each of the upper surface of the source region $5a$ and the drain region $5b$, and gate sidewalls 14 made of an insulator are formed on the side faces of the gate electrode 15. The source region $5a$ includes a p-type impurity region $5a_1$ having a large junction depth, and a p-type impurity region (an extension region) $5a_2$ having a small junction depth. The drain region $5b$ also includes a p-type impurity region $5b_1$ having a large junction depth, and a p-type impurity region (an extension region) $5b_2$ having a small junction depth.

The gate insulating film 11 is a HfSiON film and preferably has a physical film thickness of 5 nm or less. The gate electrode 15 has a stacked structure of layers $15a$ and $15b$. The layer $15a$ in contact with the gate insulating film 11 is a Ni silicide layer. This Ni silicide layer $15a$ is a $Ni_3Si$ phase of 3:1 in Ni/Si composition ratio, and has a layer thickness of 53 nm. The layer $15b$ formed on the Ni silicide layer $15a$ is a silicide layer made of orthorhombic $TiSi_2$, and has a layer thickness of 16 nm. In FIG. 1, the entire Ni silicide layer $15a$ is the above described $Ni_3Si$ crystalline phase. However, the work function does not change, as long as a $Ni_3Si$ crystalline phase in the form of a layer is provided at the interface region with the gate insulating film 11 in the gate electrode 15. Accordingly, the Ni silicide layer $15a$ may have a $Ni_3Si$ crystalline phase in the form of a layer at the interface region with the gate insulating film 11, and a Ni silicide of another crystalline phase formed on the $Ni_3Si$ crystalline phase.

In this embodiment, the distance (the gate length) between the source region $5a$ and the drain region $5b$ of the gate structure consisting of the gate insulating film 11 and the gate electrode 15 should preferably be 40 nm or less.

The effective work function of $Ni_3Si$ is 4.8 eV, which is a greater effective work function $\Phi eff$ than the median of the band gap of silicon preferable for a p-channel MIS transistor. Particularly, in a p-channel MIS device for high-speed operations, a low threshold voltage of 0.5 eV or less can be easily achieved, if the effective work function $\Phi eff$ is 4.85 eV or more. Here, the effective work function $\Phi eff$ is the work function of the gate electrode at the interface with the gate insulating film. The effective work function $\Phi eff$ is extracted from the film thickness dependency of the gate insulating film of the flat-band voltage Vfb determined by the C-V characteristics of a MIS capacitor by linear extrapolation of the flat-band voltage Vfb obtained when the film thickness of the oxide film is "0". The effective work function $\Phi eff$ of the gate electrode is extracted with the use of the substrate Fermi level determined by the impurity concentration of the silicon substrate. The value of the effective work function $\Phi eff$ is determined by the Fermi level at the interface of the gate electrode in contact with the gate insulating film. To extract the effective work function $\Phi eff$ in this embodiment, only the fixed charge amount at the interface between the insulating film and the silicon substrate is subtracted from the film thickness dependency of the flat-band voltage Vfb on the thickness of the insulating film, and it is assumed that no fixed charges exist in the gate insulating film 11 made of HfSiON. In reality, fixed charges exist in the gate insulating film, though the amount of it is ten or more times smaller than the fixed charge amount at the interface in terms of area density, and the value of the effective work function $\Phi eff$ determined by the fixed charge amount has an error of approximately 0.05 eV. In either case, however, an effective work function $\Phi eff$ necessary for obtaining a low threshold voltage can be achieved.

Meanwhile, with the $TiSi_2$ layer $15b$ being employed as the upper layer, the deposition variation caused when the polycrystalline silicon electrode goes through a phase transition to a silicide electrode by an interface solid-phase reaction during the manufacturing process can be made smaller. Accordingly, the deterioration in performance due to the increase in device reliability and the stress application, and the variation caused during the device manufacture can be restrained. This will be described in detail in the later description of a method for manufacturing a MIS transistor in accordance with this embodiment.

Examples of gate insulating film materials other than HfSiON include high-k materials such as SiON, $Si_3N_4$, $Al_2O_3$, $Ta_2O_5$, $TiO_2$, $La_2O_5$, $CeO_2$, $ZrO_2$, $HfO_2$, $SrTiO_3$, and $Pr_2O_3$. Other than those materials, a silicate having metal ions mixed with a silicon oxide of any of those materials is also effective, and a combination of any two of those materials, such as a LaAl oxide or a LaHf oxide, may also be employed. In any way, a material having enough heat resistance for transistors of each generation and their manufacturing processes should be employed.

In a case where the subject device requires a high threshold voltage, a material having a smaller effective work function $\Phi eff$ than the $Ni_3Si$ employed in this embodiment and a closer value to the median of the band gap of silicon, such as a $Ni_2Si$ crystalline phase, should be used as the layer 15a. The effective work function $\Phi eff$ of $Ni_2Si$ is 4.75 eV.

This embodiment is of course also effective in cooperation with the substrate technique for reducing the threshold value of a transistor. More specifically, a mixed crystal semiconductor having a small band gap, such as SiGe, SiC, or SiGeC, may be used as the channel material, or a threshold voltage control technique involving segregation of N or F ions at the channel portion may be used. Those substrate techniques can be controlled independently of the effect of decreasing the threshold voltage by controlling the effective work function $\Phi eff$ of the gate electrode. The effects of them are also independent of each another. Accordingly, those techniques may be used together with each other, so as to achieve a desired threshold voltage.

The height of the gate electrode 15, which is the total layer thickness of the $Ni_3Si$ layer 15a and the $TiSi_2$ layer 15b, is preferably 100 nm or smaller, and needs to be reduced as the gate length is reduced. If the gate electrode 15 is too high for the gate length, the mechanical strength becomes insufficient, and hinders the device manufacture, as the device becomes unable to sustain its structure. Typically, the gate electrode 15 should preferably have a height twice to three times greater than the gate length. If the height of the gate electrode 15 is too small, the required sheet resistance value cannot be achieved by the gate electrode, resulting in degradation of the device characteristics. Therefore, the gate electrode 15 needs to have the height necessary to achieve the sheet resistance required for each device technology generation. The height of the gate electrode 15 must be at least 20 nm.

As described above, by the techniques disclosed in A. Lauwers et al., IEDM 2005 technical digest, p.p. 661-664 and A. Veloso, et al., VLSI-sympo. 2006 technical digest, p.p. 116-117, the volume expansion coefficient of the polycrystalline silicon electrode cannot be made lower at the time of formation of a silicide having a higher Ni/Si composition ratio than 1, such as $Ni_3Si$ or $Ni_2Si$. As a result, the reliability becomes lower, and a variation in channel mobility is caused. In this embodiment, on the other hand, a Ti silicide having a lower Ti/Si composition ratio than the Ni/Si composition ratio of the Ni silicide is formed, so as to lower the volume expansion coefficient. In this manner, the deterioration of reliability and the mobility variation can be restrained.

In this embodiment, the Ti/Si composition ratio of the Ti silicide phase of the upper layer 15b is ½, but the Ni/Si composition ratio of the Ni silicide layer 15a is 3. Accordingly, as long as Ti/Si is smaller than 3, degradation of the device characteristics due to the deposition variation caused in the phase transition can be reduced. Therefore, the upper layer 15b may be a Ti silicide phase ($Ti_5Si_3$, $TiSi_2$) or an alloy film of those phases mixed therein. However, a phase having a smaller Ti/Si composition ratio exhibits the above described effects to a greater degree.

The Ti silicide phase may be a TiSiO layer containing oxygen elements, or may contain a $TiO_2$ phase, or may be a stacked structure such as $TiO_2/TiSi_2$. During the manufacturing process, Ti has the effect of reducing the Ni silicide to oxygen. As will be described later, this effect is utilized in manufacturing the MIS transistor of this embodiment. Accordingly, in a case where the Ni silicide or the surface of the Ni silicide contains a large amount of oxygen during the manufacturing process, the oxygen might be contained in the Ti silicide and form the above described TiSiO or $TiO_2$. In such a case, the above described effects can be achieved by forming a phase having a smaller Ti/Si composition ratio than 3. In a case where a layer containing a large amount of oxygen is formed, however, it is necessary to add the procedure for thoroughly removing the oxide layer from the contact portion before wiring plugs are formed. In the following embodiments, a $TiSi_2$ layer having the optimum effect for reducing the height of the gate electrode is formed on the gate electrode. However, it is possible to employ any of the above described layers containing Ti.

The crystal grain size of the gate electrode should preferably be ½ or smaller than the gate length, in view of the variation of the effective work function $\Phi eff$.

In this embodiment, a work function suitable for reducing the threshold voltage of a transistor formed on a bulk substrate can be achieved, as described above. Therefore, the substrate 1 should preferably be a bulk substrate, as shown in FIG. 1. Since the effect of controlling the work function of the gate electrode is achieved regardless of the structure of a Si substrate, a SOI substrate may be employed. For example, in a complete-depletion transistor formed on a SOI substrate, the threshold voltage is lower than the threshold voltage in a transistor formed on a bulk substrate. Therefore, to form a low power-consumption transistor on a SOI substrate, a gate stacked structure should be formed by switching the gate electrode structures between the n-channel MIS transistor and the p-channel MIS transistor of this embodiment. Although Si is used for the channel region in this embodiment, it is also possible to use SiGe, Ge, distortion Si, or the like, which has higher mobility than Si.

The source/drain regions in this embodiment are formed with silicon layers containing high-concentration impurities as in the conventional transistor structures. However, it is possible to employ a Schottky-type source/drain structure in which the silicon layers are replaced with silicides, or a segregation Schottky structure having impurities segregated at the interface between the silicon substrate and the silicides. It is also possible to employ a structure in which SiGe mixed crystals or SiC mixed crystals having 5% or less of C added to Si are buried in the diffusion layer region, and uniaxial distortion is caused in the channel portion. In any way, an optimum source/drain structure should be employed for each device generation.

Manufacturing Method in Accordance with First Embodiment

Referring now to FIGS. 2 through 5, a method for manufacturing a semiconductor device in accordance with the first embodiment is described.

First, the HfSiON film 11 to be used as the gate insulating film is formed on the surface of the silicon substrate 1 by MOCVD (Metal Organic Chemical Vapor Deposition). If an insulating film made of a high-permittivity material is formed, some other film formation method such as ALD (Atomic Layer Deposition) may be used, or Si or N may be added to the film formed by ALD.

Figure 2:
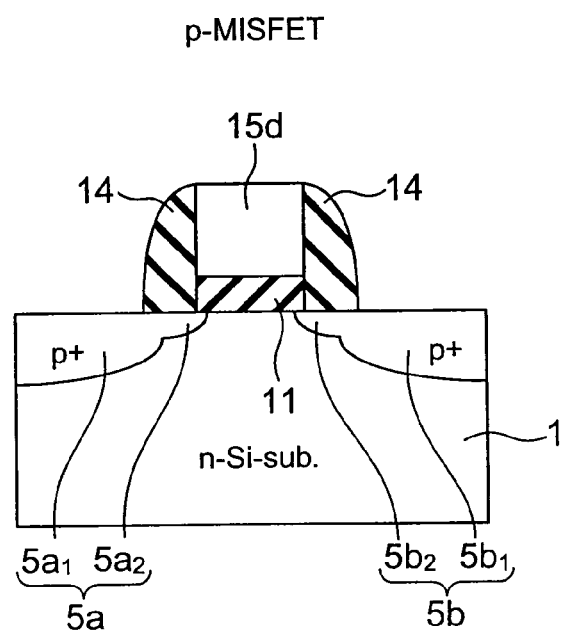
FIGS. 2 through 4 are cross-sectional views illustrating the procedures for manufacturing the pMISFET according to the first embodiment.

A 40-nm polycrystalline silicon layer 15d to be used as the gate electrode is then deposited by low-pressure CVD. Patterning is then performed on the polycrystalline silicon layer 15d and the gate insulating film 11 by a lithography technique or anisotropic etching, so as to shape the structure into the form of a gate electrode (FIG. 2).

Boron ions are then implanted, so as to form the extension regions $5a_2$ and $5b_2$ having high impurity concentration and a small junction depth. To form the extension regions, elevated extension regions that can characteristically restrain short channel effects may be formed by selective epitaxial growth. Also, impurities may be introduced at the same time as the formation of the elevated extension regions.

The sidewalls 14 are then formed to insulate the gate electrode from the source and drain regions. Boron ion implantation is then performed with a higher acceleration voltage than that in the formation of the extension regions $5a_2$ and $5b_2$, so as to form the impurity regions $5a_1$ and $5b_1$ that has high impurity concentration and has a greater junction depth than that of the extension regions $5a_2$ and $5b_2$. In this manner, the source and drain regions 5a and 5b are formed (FIG. 2).

Figure 3:
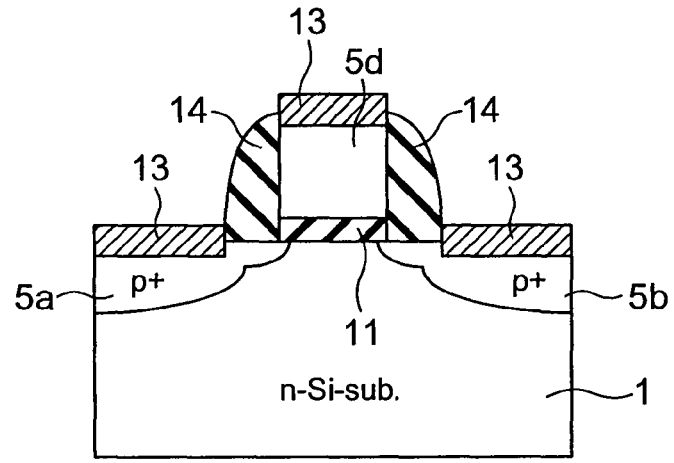

A Ni film of 8 nm in film thickness is then formed by sputtering. Heat treatment at 400° C. is then carried out, so as to form the NiSi layer 13 over the source and drain regions 5a and 5b and the polycrystalline silicon layer 5d. The unreacted Ni in the regions other than the region of the NiSi layer 13 is removed by selective etching with a $H_2SO_4$ solution, so as to selectively leave the NiSi layer 13 only on the source and drain regions 5a and 5b and the polycrystalline silicon layer 5d (FIG. 3).

Figure 4:
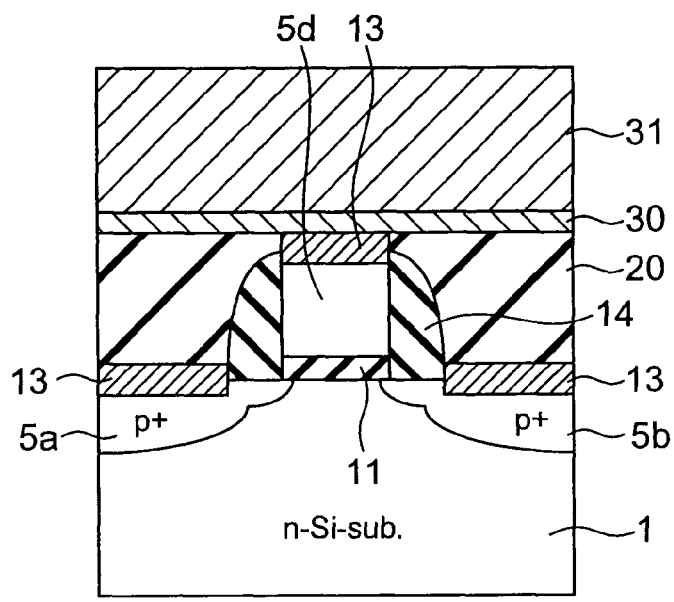

A silicon oxide film 20 to be the interlayer insulating film is then deposited by low-pressure CVD, and the upper face of the NiSi layer 13 of the gate electrode is exposed by CMP (Chemical Mechanical Polishing). A Ti film 30 of 8 nm in film thickness and a Ni film 31 of 33 nm in film thickness are formed one by one by a sputtering technique (FIG. 4). Low-temperature heat treatment is then carried out at 500° C., so that the polycrystalline silicon layer 5d turns into a stacked structure having a $Ni_3Si$ phase as the lower layer 15a and a $TiSi_2$ phase as the upper layer 15b, as shown in FIG. 1. The duration of the heat treatment depends on the heat treatment temperature and the film thickness of the Ti film 30, but is preferably in the range of 10 seconds to one hour. If the heat treatment lasts more than one hour, the production costs become higher relative to productivity. If the heat treatment lasts less than 10 seconds, some devices might have insufficient Ni diffusion at the interface portion. The temperature needs to be in the range of 300° C. to 600° C. If the temperature is lower than 300° C., the Ni diffusion speed is low, and the production costs become higher. If the temperature is higher than 600° C., the gate insulating film 11 is damaged from the interface with the gate insulating film 11, and the device reliability is reduced.

Figure 6:
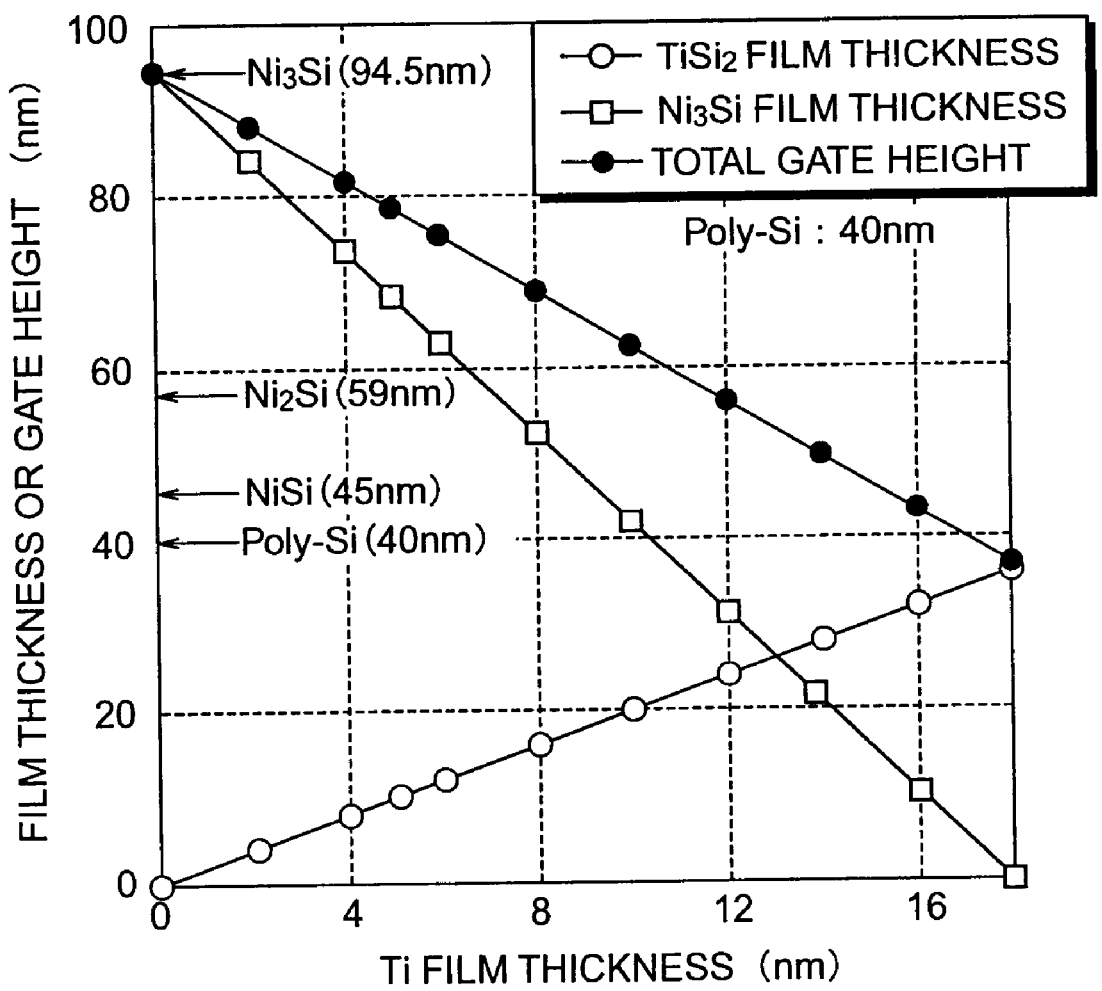
FIG. 6 shows the relationship among the Ti insertion film thickness and the heights of the $TiSi_2/Ni_3Si$ film, the $Ni_3Si$ layer, and the $TiSi_2$ layer.

The above described reaction is caused by inserting the highly-reducible Ti film 30 at the interface between the Ni film 31 and the NiSi layer 13 on the polycrystalline silicon layer 5d, so as to reduce the natural oxide layer on the surface of the NiSi layer 13. Accordingly, the interfacial reaction between the Ni film 31 and the NiSi film 13 is facilitated. Normally, when a Ni silicide layer is exposed to the air, an oxide layer or a NiSiO layer containing a large amount of oxygen is formed on the uppermost surface. If the Ni film 31 is formed directly on the NiSi layer 13 on the polycrystalline silicon layer 5d in such a case, the oxide layer hinders the solid-phase reaction at the interface between the Ni film 31 and the NiSi layer 13, and the reaction does not progress. Also, unlike the natural oxide film on the silicon, the oxide layer cannot be selectively removed by carrying out diluted hydrofluoric acid treatment. To counter this problem, by the manufacturing method of this embodiment, the highly-reducible Ti film 30 is inserted at the interface between the Ni film 31 and the NiSi layer 13, so as to reduce the surface oxide layer of the NiSi layer 13 on the polycrystalline silicon layer 5d, and facilitate the Ni diffusion. In this manner, the $Ni_3Si$ layer 5a can be formed to reach the interface with the gate insulating film 11. As will be described later, the insertion film thickness of the Ti should be controlled so as to obtain a gate electrode with a desired height. However, the Ti film 30 becomes thicker, the speed at which Ni is introduced into the polycrystalline silicon layer 5d becomes lower. In such a case, heat treatment needs to be carried out at a high temperature of 600° C. or higher, or heat treatment needs to be carried out for one hour or longer. Therefore, the film thickness of the Ti film 30 is preferably 20 nm or smaller. The smallest possible effective film thickness the Ti film 30 can have varies with the oxidation state of the surface of the NiSi layer 13. If the amounts of oxygen film phase and oxygen existing on the surface and in the vicinity of the NiSi layer 13 are large, the Ti film 30 needs to have such a film thickness as to sufficiently reduce the oxygen. Therefore, the Ti film 30 needs to have a film thickness of 1 nm or greater. When the smallest possible film thickness the Ti film 30 formed by a sputtering technique can have is taken into consideration, the Ti film 30 should preferably have a film thickness of 5 nm or greater. In a case where the height of the polycrystalline silicon electrode is 40 nm as in this embodiment, a 2-nm $TiSi_2$ layer is formed by inserting a 1-nm Ti film. If a Ti film of 20 nm is inserted in such a case, all the Si is consumed to form a $TiSi_2$ layer, and therefore, a $Ni_3Si$ layer cannot be formed at the interface with the gate insulating film. With the variation among the MIS transistors during the manufacturing process being taken into consideration, the thickness of the $Ni_3Si$ layer needs to be 5 nm or greater, so as to form uniform MIS transistors. Therefore, the greatest possible film thickness to be inserted the Ti film 30 can have is 16 nm in this embodiment, and the thickness of the $TiSi_2$ layer formed in such a case is 32 nm. Within this range, the volume expansion coefficient can be controlled by adjusting the film thickness of the Ti film to be inserted, and the height of the gate electrode can be varied freely, as shown in FIG. 6. The Ni film to be formed on the Ti film should have an amount of Ni enough to turn the unconsumed Si in the formation of the $TiSi_2$ layer into $Ni_3Si$. The amount of Ni should be at least 1.8 times or greater than the remaining amount of Si.

Figure 5:
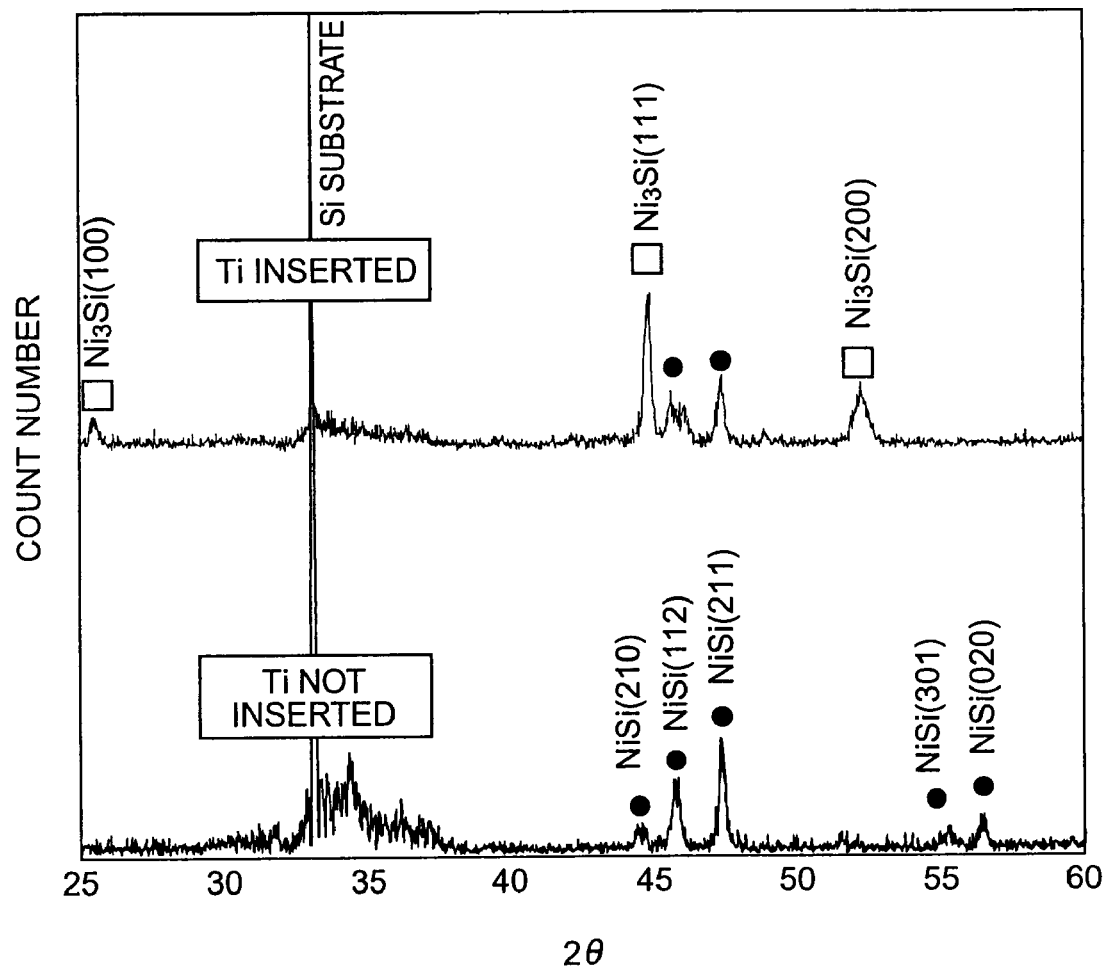
FIG. 5 shows the XRD diffraction spectrum observed in cases where a Ti film is inserted between the Ni film and the NiSi film, and not inserted.

In the following, the results of experiments carried out to examine the effect of facilitating the interfacial reaction between the Ni film and the NiSi layer by the Ti insertion method in accordance with this embodiment are described. FIG. 5 shows the results of an analysis carried out on the crystalline structures of electrodes by XRD (X-ray diffractometry) after heat treatment. One of the structures had a Ti film inserted at the interface between the Ni film and the NiSi layer, and the other one of the structures did not have a Ti film. Each electrode structure prior to the formation of the Ni film and the Ti film was a stacked structure having a 30-nm thick NiSi layer as the upper layer and a 30-nm thick polycrystalline silicon layer as the lower layer. The Ti film to be inserted was 4 nm in film thickness, and the Ni film was 60 nm in film thickness. After the film formation, heat treatment in a nitrogen atmosphere was carried out at 500° C. for 5 minutes. When a Ti film was not inserted at the interface, a diffraction peak due to the NiSi phase was observed. Because of this, it is apparent that a $Ni_3Si$ phase was not formed with the interfacial reaction between the Ni film and the NiSi layer.

When a Ti film was inserted, it was found that a diffraction peak due to the $Ni_3Si$ phase prior to the processing was mainly caused, and Ni was diffused into the polycrystalline silicon layer. As a result, the NiSi went through a phase transition to $Ni_3Si$. In this case, the $Ni_3Si$ layer 15a was formed, as the film thickness of the Ni film was sufficient for forming the $Ni_3Si$ layer 15a. A $Ni_2Si$ layer can be formed by adjusting the film thickness of the Ni film to 60 nm or smaller. In the case where a Ti film was inserted, a diffraction peak of a NiSi phase with partially low diffraction strength was observed, and a part of the NiSi region that had not reacted yet remained. This is because the film thickness of the Ti film was not large enough relative to the oxidation state of the NiSi surface, or an unreacted region was formed due to the uniformity of the Ti film. In either case, the Ti film should be made thicker, so that the uniformity of the Ti film does not become a problem during the manufacturing process.

Other than the Ti film insertion, the oxygen in the surface of the NiSi layer 13 may be removed by a pre-sputtering technique. In such a case, however, etching by the sputtering is performed also on the interlayer insulating film 17 other than the gate electrode, and the degradation of the insulating properties and the variation of the transistor operations are increased.

By the above described manufacturing method, after the gate electrode 15 having a stacked structure of the $TiSi_2$ layer 15b and the $Ni_3Si$ layer 15a is formed, the unreacted Ni and Ti are removed by acid solution treatment. By doing so, the MIS transistor of the first embodiment shown in FIG. 1 is obtained.

By virtue of the manufacturing method of this embodiment, the gate electrode does not need to be protected with a SiN film at the time of the formation of the silicide layer 13 in the source and drain regions prior to the full-silicidation of the gate electrode. Accordingly, the procedures for forming, processing, and removing a SiN film become unnecessary, and the number of manufacturing procedures can be reduced.

As described above, the silicide layer 15b having a $TiSi_2$ phase is formed on the $Ni_3Si$ layer 15a, so as to reduce the volume expansion from the polycrystalline silicon layer 5d. FIG. 6 shows the relationship among the insertion film thickness of the Ti film 30, the height of the gate electrode having a stacked structure of the $TiSi_2$ layer 15b and the $Ni_3Si$ layer 15a, the height of the $Ni_3Si$ layer 15a, and the height of the $TiSi_2$ layer 15b, which are observed in a case where the height of the polycrystalline silicon layer 5d of this embodiment is 40 nm. As can be seen from FIG. 6, the $TiSi_2$ layer 15b having a larger silicon composition becomes thicker as the film thickness of the Ti film increases. Accordingly, the volume expansion coefficient of the gate electrode at the time of the formation of the silicide electrode becomes smaller, and the height of the gate electrode can be reduced. In a case where a Ti film is not inserted during the manufacturing process, the height of the gate electrode becomes 2.36 times greater than the height of the polycrystalline silicon layer, and the gate insulating film 11 is distorted as the volume expansion is caused in the gate electrode 15 located immediately above the gate insulating film 11. As a result, defects are caused in the gate insulating film 11, resulting in poorer reliability of the gate insulating film. The Si in the channel portion is also distorted, and a variation is caused in the channel mobility. As a result, the LSI circuit design becomes difficult. On the other hand, in a case where a Ti film of 10 nm in film thickness is inserted, the expansion coefficient of the gate electrode is restricted to a value 1.5 times greater than the polycrystalline silicon layer. If the film thickness of the Ti film is reduced to approximately 16 nm, the variation of the gate height can be restricted to 10% or less, even after the formation of a gate electrode having a stacked structure of a $TiSi_2$ layer and a $Ni_3Si$ layer. By adjusting the film thickness of the Ti film to be inserted, the height of the gate electrode can be continuously varied, and the degradation of the reliability and the device characteristics can be restrained.

Ni was also deposited on the polycrystalline silicon layer of 40 nm in layer thickness, so as to form gate electrodes of $Ni_2Si$ and NiSi phases. The heights of the gate electrodes were 59 nm in the case of $Ni_2Si$, and 45 nm in the case of NiSi, as shown in FIG. 6. As will be described in the second embodiment and later, the Ni—Si composition of each gate electrode should preferably be varied in accordance with the conductivity type, so as to adjust the threshold voltage of each of the transistors constituting a CMIS device. In such a case, however, a variation in height is caused at the time of the formation of silicide gates having different compositions, with the use of polycrystalline silicon layers of the same height, as shown in FIG. 6. As a result, the formation of contact plugs for the upper wiring layer becomes difficult.

By carrying out the Ti film insertion process of this embodiment, however, the height of each gate electrode can be controlled in accordance with the film thickness of the Ti film to be inserted, independently of the Ni—Si composition. Accordingly, the above described problem can be eliminated. For example, in a case where the n-channel MIS transistor is a NiSi electrode, a 15.5-nm thick Ti film is inserted, so that the height of the gate electrode of $TiSi_2/Ni_3Si$ to be used in the p-channel MIS transistor becomes 45 nm, which is the same as the height of the gate electrode of the n-channel MIS transistor. In a case where the n-channel MIS transistor is a $Ni_2Si$ electrode, a 11-nm thick Ti film is inserted, so that the height of the gate electrode of $TiSi_2/Ni_3Si$ to be used in the p-channel MIS transistor becomes 59 nm, which is also the same as the height of the gate electrode of the n-channel MIS transistor. However, since the polycrystalline silicon layer is a polycrystalline structure prior to the formation of a silicide, the heights of the gate electrodes of transistors vary by 5 nm to 10 nm. This variation also exists in a case where a silicide electrode is formed, and the variation becomes larger due to volume expansion. However, the variation remains within the allowable range by optimizing the process conditions at the time of the formation of contact plugs. The heights of the gate electrodes of the p-channel MIS transistor and the n-channel MIS transistor are made equal to each other, so that the etching depth of the interlayer insulating film at the time of the formation of contact holes becomes uniform. Accordingly, the setting of the process conditions becomes easier, and higher production yield can be achieved.

The difference in the gate electrode height between the transistors of the two conductivity types can be made smaller by a method involving reactive ion etching (RIE) (see A. Lauwers et al., IEDM 2005 technical digest, p.p. 661-664) or by a method utilizing a SiGe cap layer (see A. Veloso, et al., VLSI-sympo. 2006 technical digest, p.p. 116-117). In either case, however, it is difficult to control the film thickness of a polycrystalline silicon layer by 5 nm or less. Therefore, it is difficult to achieve the same gate heights between the transistors of both conductivity types.

In this embodiment, on the other hand, the film control can be controlled by adding a Ni or Ti film, and the film thickness control can be performed by 1 nm. It is of course possible to combine this embodiment of the present invention with the above described method for controlling a polycrystalline silicon gate height. However, to reduce the height of a polycrystalline silicon gate by the above described method, it is necessary to take the film thickness controllability into consideration so as not to cause a large variation. Typically, the height of a polycrystalline silicon gate needs to be ½ or more of the initial height.

If the heat treatment temperature is low, or if the Ti film is thick, $Ti_5Si_3$ or a silicide phase having Ni solid-solved in $Ti_5Si_3$, instead of $TiSi_2$, is formed as the upper silicide layer. In such a case, the effect of restraining expansion of the gate electrodes becomes smaller than that in the case of $TiSi_2$, but each gate height can be made smaller than that in a case where all the gate electrodes are $Ni_3Si$ phases.

Although Ti is used as the metal for reducing the oxide layer on the surface of the NiSi layer in this embodiment, it is also possible to use a metal element exhibiting high solubility with respect to Ti. Specifically, Hf or Zr may be employed. Si-rich silicides of those metals are stable, and the height of each gate electrode can be controlled in the same manner as in the case of Ti by forming $HfSi_2$ or $ZrSi_2$. Also, the volume expansion of each gate electrode can be restrained, as long as the composition ratio of Hf or Zr to Si (=Hf/Si or Zr/Si) is smaller than 3. FIG. 7 shows the oxide formation energy of each of those metals, the Si consumption of each of those metals, and the specific resistance of each silicide. Having oxide formation energy with a greater absolute value than Si, those metals can easily reduce the oxide of nickel or silicon on the surface of the $Ni_2Si$ layer. Accordingly, the solid-phase reaction between nickel and a nickel silicide can be caused smoothly in a later stage. The specific resistance of a C54-$TiSi_2$ phase is lower than the specific resistance of $Ni_3Si$ or $Ni_2Si$. Accordingly, the C54-$TiSi_2$ phase has the effect of reducing the specific resistance of a gate electrode, and is a preferred material compared with Hf or Zr.

As described above, this embodiment can provide a semiconductor device including MIS transistors that have a smaller variation during the manufacturing process and have appropriate threshold voltages, and a method for manufacturing such a semiconductor device.

Second Embodiment

Figure 8:
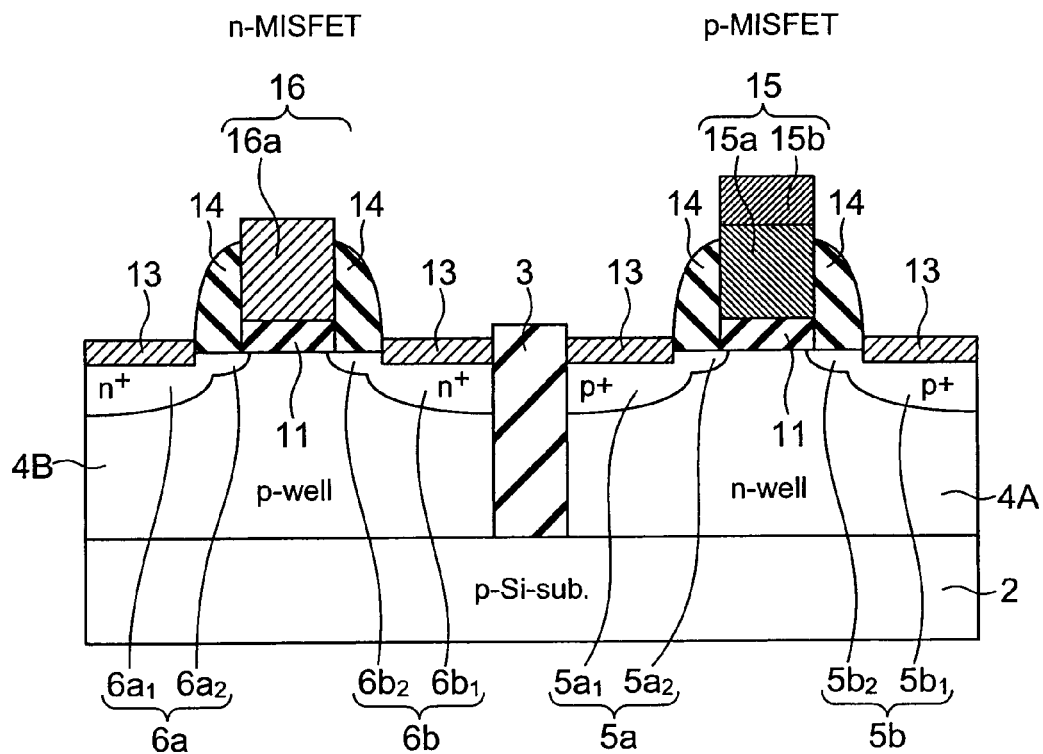
FIG. 8 is a cross-sectional view of a CMISFET according to a second embodiment, taken along the line extending in the gate length direction.

Referring now to FIG. 8, a CMISFET in accordance with a second embodiment of the present invention is described. FIG. 8 is a cross-sectional view of the CMISFET of the second embodiment, taken along a line extending in the gate length direction.

In the CMISFET of this embodiment, an n-type well region 4A and a p-type well region 4B that are isolated from each other by a device isolation region 3 made of $SiO_2$, for example, are formed on a p-type silicon substrate 2. A p-channel MISFET is formed in the n-type well region 4A, and an n-channel MISFET is formed in the p-type well region 4B.

As shown in FIG. 8, the p-channel MISFET includes p-type source and drain regions 5a and 5b that are formed at a distance from each other in the n-type well region 4A, a gate insulating film 11 that is formed on a region of the n-type well region 4A that is located between the source region 5a and the drain region 5b and serves as the channel, and a gate electrode 15 that is formed on the gate insulating film 11. A NiSi layer 13 is formed on each of the upper surface of the source region 5a and the drain region 5b, and gate sidewalls 14 made of an insulator are formed on the side faces of the gate electrode 15. The source region 5a includes a p-type impurity region $5a_1$ having high impurity concentration and a large junction depth, and a p-type impurity region (an extension region) $5a_2$ having high impurity concentration and a small junction depth. The drain region 5b also includes a p-type impurity region $5b_1$ having high impurity concentration and a large junction depth, and a p-type impurity region (an extension region) $5b_2$ having high impurity concentration and a small junction depth.

As shown in FIG. 8, the n-channel MISFET includes n-type source and drain regions 6a and 6b that are formed at a distance from each other in the p-type well region 4B, a gate insulating film 11 that is formed on a region of the p-type well region 4B that is located between the source region 6a and the drain region 6b and serves as the channel, and a gate electrode 16 that is formed on the gate insulating film 11. A NiSi layer 13 is formed on each of the upper surface of the source region 6a and the drain region 6b, and gate sidewalls 14 made of an insulator are formed on the side faces of the gate electrode 16. The source region 6a includes an n-type impurity region $6a_1$ having high impurity concentration and a large junction depth, and an n-type impurity region (an extension region) $6a_2$ having high impurity concentration and a small junction depth. The drain region 6b also includes an n-type impurity region $6b_1$ having high impurity concentration and a large junction depth, and an n-type impurity region (an extension region) $6b_2$ having high impurity concentration and a small junction depth.

The gate insulating films 11 of both the p-channel MISFET and the n-channel MISFET are at least HfSiON film, and each have a physical film thickness of 5 nm or less.

The gate electrode 15 on the n-type well region 4A has a stacked structure consisting of the same two layers as the electrode structure of the p-channel MISFET of the first embodiment. The upper layer 15b is a Ti silicide layer of a $TiSi_2$ phase, and the lower layer 15a is a Ni silicide layer of a $Ni_3Si$ phase. The gate electrode 16 on the p-type well region 4B is formed with a Ni silicide layer 16a of a NiSi phase.

The distance (the gate length) between the source and drain of each of the gate structures formed with the gate insulating films 11 and the gate electrodes 15 and 16 is preferably 30 nm or less for both conductivity types.

The n-channel MIS transistor and the p-channel MIS transistor operate in a complementary fashion, and constitute a CMIS device. The ratio between the gate heights of the gate electrodes 15 and 16 is smaller than 1.88, which is the ratio between the heights of the $Ni_3Si$ electrode and the NiSi electrode in a case where the Ni silicide compositions of the same polycrystalline silicon layers are controlled by adjusting the film thickness of a Ni film. Accordingly, the formation of contact vias connecting the wires and the gate electrodes becomes easier, and the LSI production yield becomes higher. Like the structure of the first embodiment, the structure of this embodiment can restrain volume expansion of the gate electrode of the p-channel MIS transistor, can reduce the height of the gate electrode, and can restrain a variation during the manufacture, though described later in detail in the description of the manufacturing method in accordance with this embodiment.

In this embodiment, the gate electrode structure is designed to achieve different effective work functions Φeff, so as to optimize each threshold voltage in accordance with the conductivity type. The gate electrode layer of the n-channel MIS transistor of this embodiment is the NiSi layer 16a, and the effective work function Φeff of the NiSi layer 16a is 4.51 eV, which is smaller than the Si mid-gap level on the HfSiON. Accordingly, a low threshold voltage operation of the n-channel MIS transistor can be realized. In the p-channel MIS transistor, it is the Ni$_3$Si layer 15a of the gate electrode 15 that is in contact with the gate insulating film 11. The effective work function Φeff of Ni$_3$Si layer 15a is 4.80 eV on the HfSiON, which is a suitable value for achieving a low threshold voltage in the p-channel MIS transistor. This embodiment is of course effective in combination of the substrate technique for reducing the threshold voltage of each transistor. More specifically, a mixed crystal semiconductor having a small band gap, such as SiGe, SiC, or SiGeC, may be used as the channel material, or a threshold voltage control technique involving segregation of N or F ions at the channel portion may be used.

Manufacturing Method in Accordance with Second Embodiment

Figure 9:
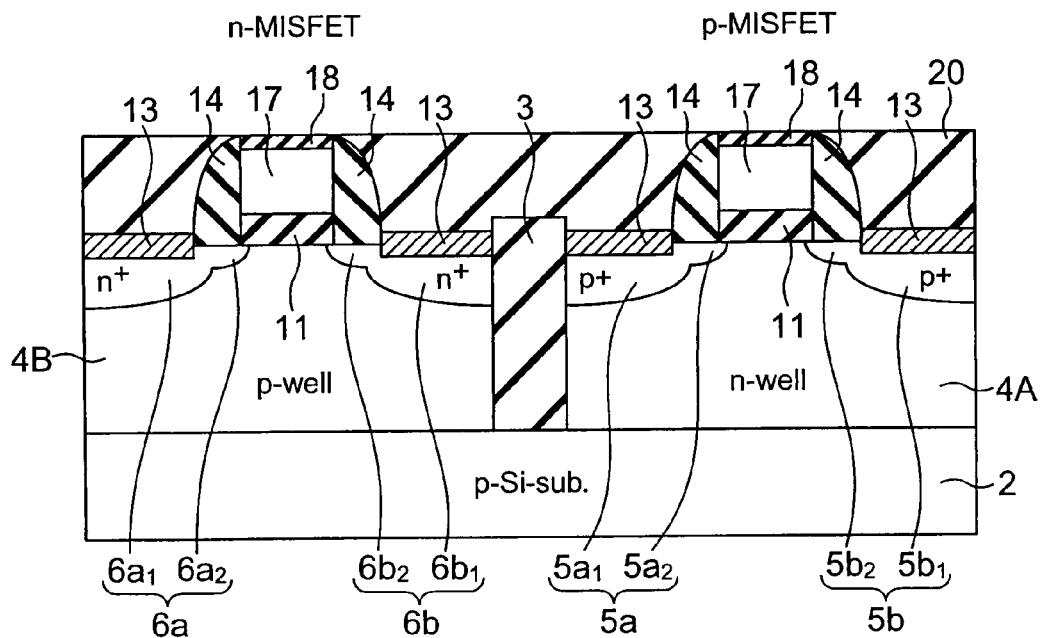
FIGS. 9 through 11 are cross-sectional views illustrating the procedures for manufacturing the CMISFET according to the second embodiment.
Figure 10:
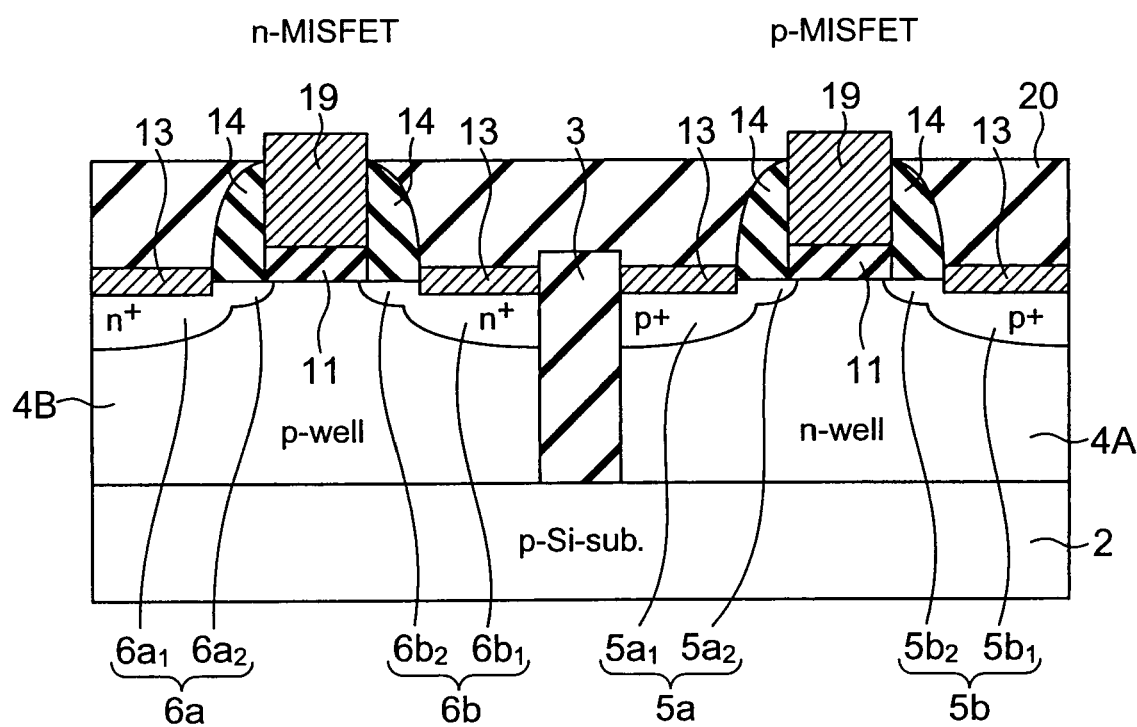
Figure 11:
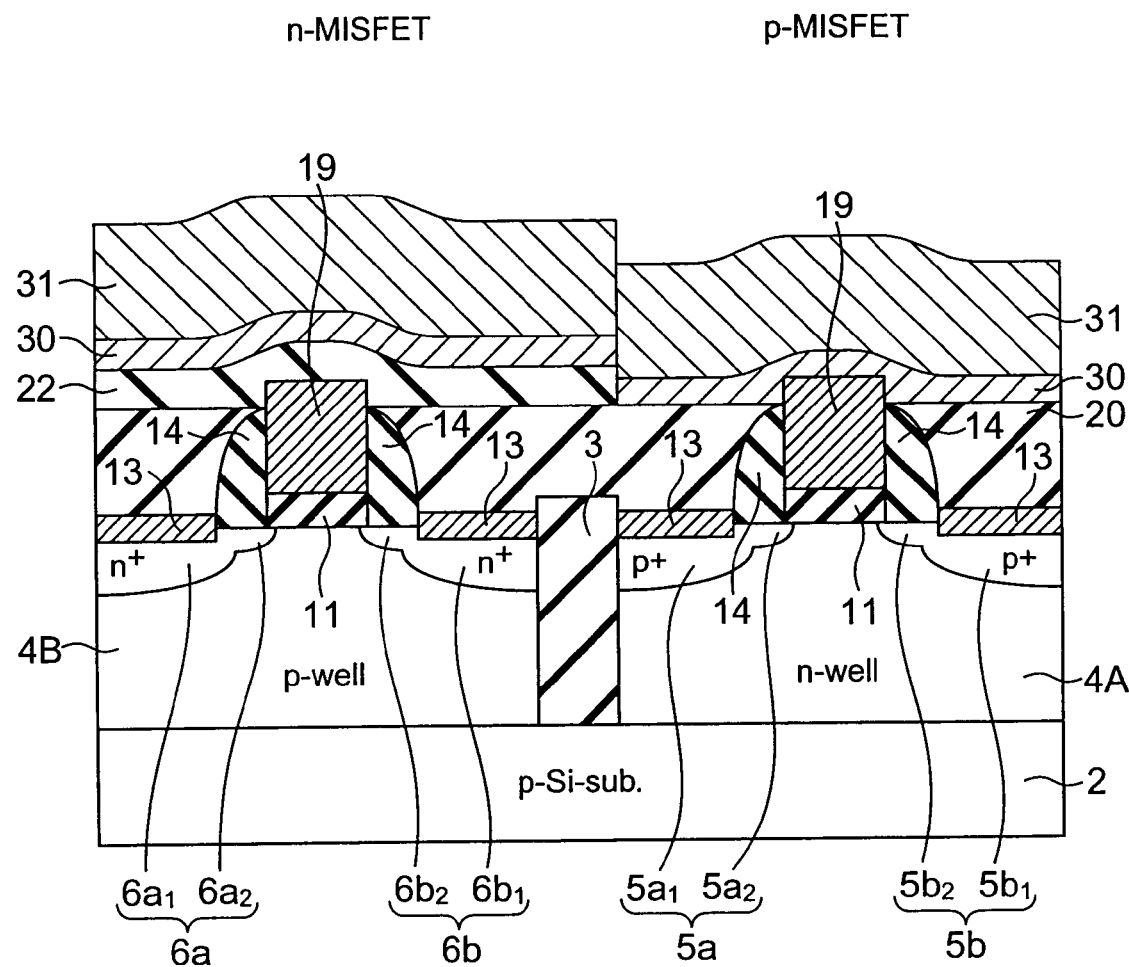

Referring now to FIGS. 9 through 11, a method for manufacturing a semiconductor device in accordance with the second embodiment is described. First, as shown in FIG. 9, a device isolation region 3 is formed in the p-type silicon substrate 2. This device isolation region 3 may be formed by the local oxidation technique or the shallow trench technique, and may be of a mesa type. Ion implantation is then performed to form the p-type well region 4A and the n-type well region 4B. A gate insulating film 11 made of HfSiON is formed on the surface of the silicon substrate 2. A 40-nm polycrystalline silicon layer 17 to be used as the gate electrodes is then deposited by low-pressure CVD. A SiN layer 18 to be used as the hard mask in the NiSi layer formation for the source and drain regions is deposited on the polycrystalline silicon layer 17. Patterning is then performed on the SiN layer 18, the polycrystalline silicon layer 17, and the gate insulating film 11 by a lithography technique or an anisotropic etching technique, so as to shape the structure into gate electrodes. As described in the first embodiment, the deposition of the SiN layer 18 may be omitted, if a NiSi layer is formed for the gate electrodes at the same time of the NiSi layer formation for the source and drain regions.

Boron ions are then implanted in the formation region of the p-channel MIS transistor, so as to form the p-type extension regions 5a$_2$ and 5b$_2$ having high impurity concentration and a small junction depth. Phosphorus ions are implanted in the formation region of the n-channel MIS transistor, so as to form the n-type extension regions 6a$_2$ and 6b$_2$ having high impurity concentration and a small junction depth. The sidewalls 14 for insulating the gate electrodes from the source and drain regions are then formed. After that, boron ion implantation is performed in the formation region of the p-channel MIS transistor with a higher accelerate voltage than that in the formation of the extension regions, so as to form the impurity regions 5a$_1$ and 5b$_1$ having high impurity concentration and a large junction depth. Also, phosphorus ion implantation is performed in the formation region of the n-channel MIS transistor with a higher accelerate voltage than that in the formation of the extension regions, so as to form the impurity regions 6a$_1$ and 6b$_1$ having high impurity concentration and a large junction depth (FIG. 9).

A 8-nm thick Ni film (not shown) is then formed on the entire surface of the substrate by a sputtering technique, and heat treatment is carried out at 400° C., so as to form the NiSi layer 13 on each of the source and drain regions. The unreacted Ni in the other regions is removed by a selective etching technique using a H$_2$SO$_4$ solution, so that the NiSi layers 13 are selectively formed only on the source and drain regions 5a, 5b, 6a, and 6b (FIG. 9).

After that, an interlayer insulating film 20 made of silicon oxide is deposited by low-pressure CVD, and the upper surface of the SiN layer 18 is exposed by CMP (FIG. 9).

After the SiN layers 18 are removed, the natural oxide film on each polycrystalline silicon layer 17 is removed by surface treatment such as diluted hydrofluoric acid treatment, and a 23-nm thick Ni film (not shown) is formed by a sputtering technique. After that, low-temperature heat treatment is carried out at 500° C., so that the polycrystalline silicon layers 17 of the gate electrodes of both conductivity types turn into NiSi layers 19 (FIG. 10). The unreacted Ni is then removed by a selective etching technique using a H$_2$SO$_4$ solution, so as to obtain the structure shown in FIG. 10.

After only the n-channel MIS transistor region is protected with a hard mask 22 made of SiO$_2$ or SiN, a 8-nm thick Ti film 30 and a 18-nm thick Ni film 31 are formed by a continuous sputtering technique (FIG. 11). Low-temperature heat treatment is then carried out at 500° C., so that only the gate electrode 15 of the p-channel MIS transistor region turns into a stacked structure having a Ni silicide layer of a Ni$_3$Si phase as the lower layer 15a and a Ti silicide layer of a TiSi$_2$ phase as the upper layer 15b. This reaction is caused because the highly-reducible Ti film 30 is inserted at the interface between the Ni film 31 and each NiSi layer 19, so as to facilitate the interfacial reaction at the interface, as described in the description of the manufacturing method in accordance with the first embodiment.

As can be seen from FIG. 6, in this embodiment, the height of the gate electrode 15 of the p-channel MIS transistor is 68.9 nm, and the height of the gate electrode formed with the NiSi layer 16a of the n-channel MIS transistor is 45 nm. Accordingly, the height of the gate electrode 15 of the p-channel MIS transistor is 1.53 (=68.9/45) times greater than the height of the gate electrode 16 of the n-channel MIS transistor. The value 1.53 is smaller than 2.1 (94.5/45), which is the ratio between the gate height (=94.5 nm) obtained in a case where all the polycrystalline silicon layer 5d of 40 nm in thickness is turned into a Ni$_3$Si layer and the height (=45 nm) obtained in a case where all the polycrystalline silicon layer 5d of 40 nm in thickness is turned into a NiSi layer. After that, the unreacted Ni and Ti are removed by acid solution treatment, and the hard mask 22 formed in the n-channel MIS transistor region is removed, so as to obtain the structure of the CMISFET of the second embodiment shown in FIG. 8.

Figure 12:
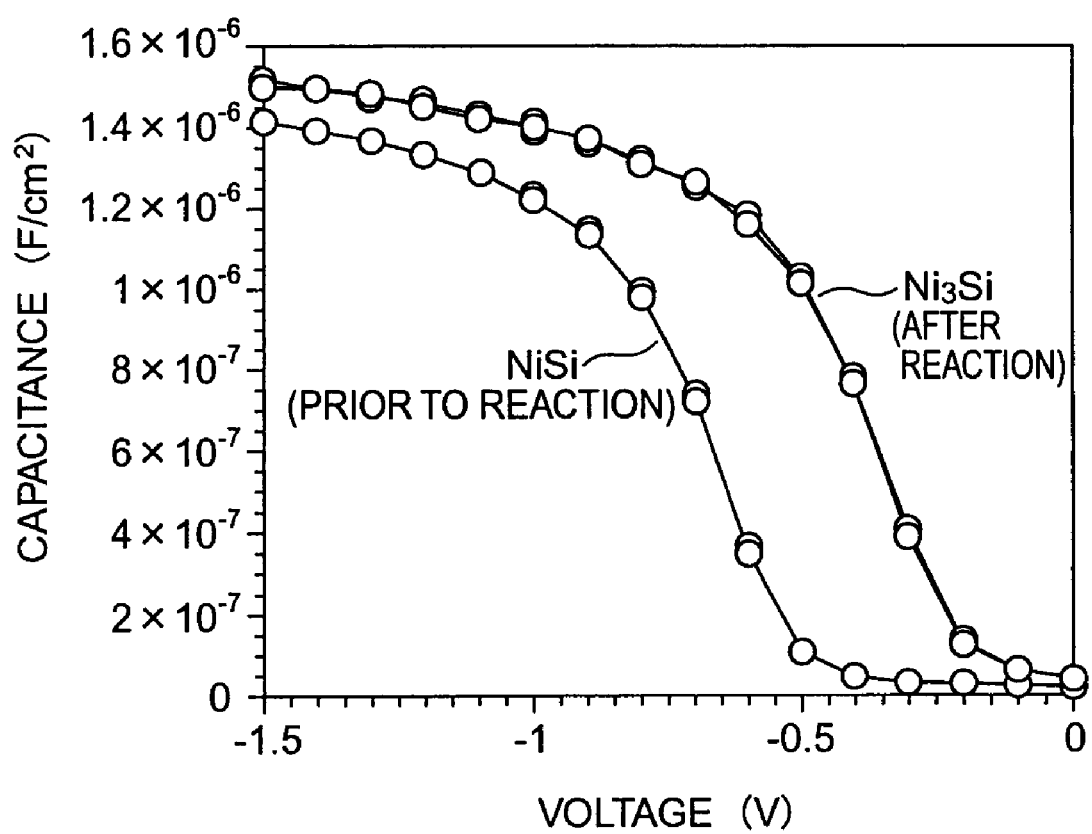
FIG. 12 shows a variation in the MIS capacitance-voltage (C-V) characteristics observed by the manufacturing method according to the second embodiment.

FIG. 12 shows the capacitance-voltage (C-V) characteristics variation of a MIS capacitor in a case where the structure of the gate insulating film interface of the silicide electrode of a NiSi phase is turned into a Ni$_3$Si phase by the manufacturing method of this embodiment. As can be seen from FIG. 12, the C-V characteristics shift in the positive bias direction, as the phase changes to the Ni$_3$Si phase. Also, the effective work function of the electrode increases from 4.51 eV, which is the work function of a NiSi electrode, to 4.8 eV, which is the work function of a Ni$_3$Si electrode.

By the manufacturing method in accordance with this embodiment, a lithography process needs to be carried out only once to form an electrode made of NiSi in the n-channel MIS transistor and an electrode made of Ni$_3$Si in the p-channel transistor, which conventionally requires two lithography processes.

First Modification of Second Embodiment

Figure 13:
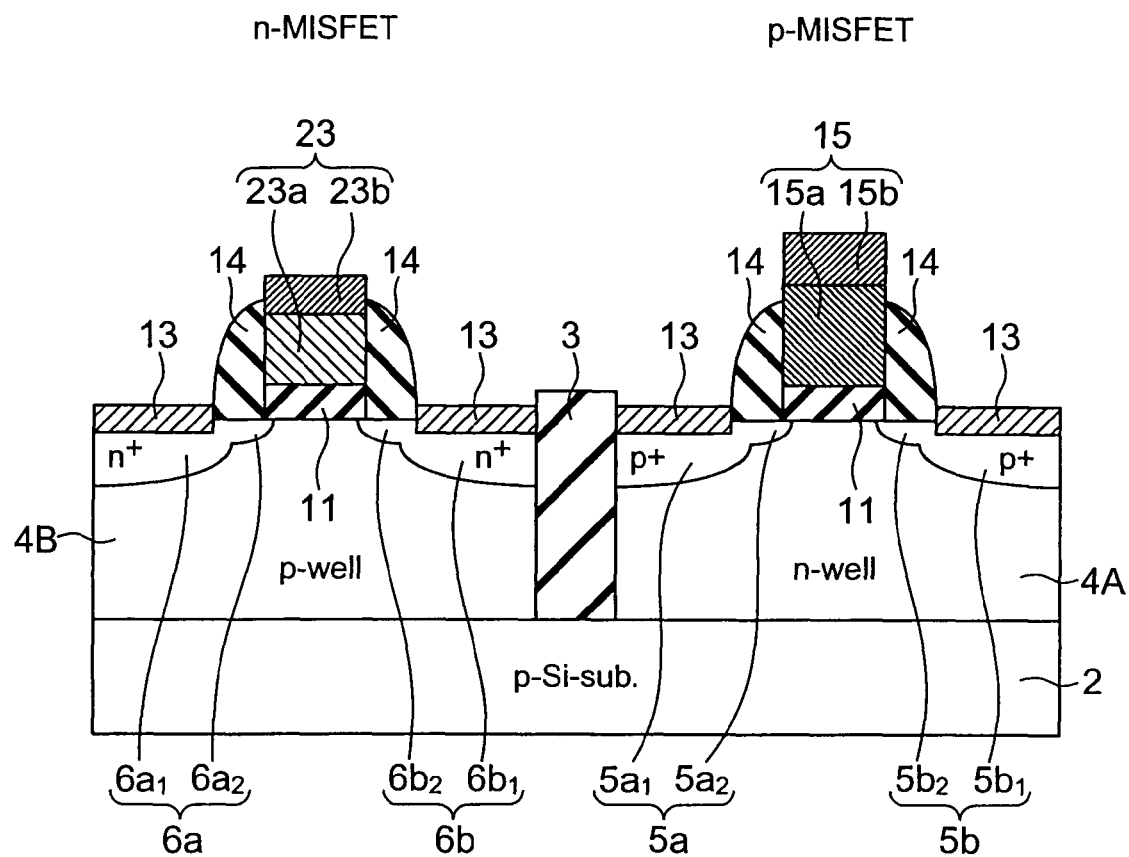
FIG. 13 is a cross-sectional view of a CMISFET according to a first modification of the second embodiment, taken along the line extending in the gate length direction.

Referring now to FIG. 13, a CMISFET in accordance with a first modification of the second embodiment is described.

FIG. 13 is a cross-sectional view of the CMISFET of this modification, taken along a line extending in the gate length direction of the CMISFET.

As shown in FIG. 13, the CMISFET of this modification has the same structure as the CMISFET of the second embodiment shown in FIG. 8, except that the gate electrode 16 of the n-channel MIS transistor is replaced with a gate electrode 23 having a stacked structure consisting of a $NiSi_2$ layer 23a as the lower layer and a $TiSi_2$ layer 23b as the upper layer.

As in the second embodiment, the gate electrode structure of this modification is designed to have different effective work functions Φeff so as to optimize each threshold voltage in accordance with the conductivity type. In the n-channel MIS transistor, the gate electrode in contact with the gate insulating film is the $NiSi_2$ layer 23a. In the p-channel MIS transistor, the gate electrode in contact with the gate insulating film is the $Ni_3Si$ layer 15a. The effective work functions Φeff of the $NiSi_2$ layer 23a and the $Ni_3Si$ layer 15a are 4.40 eV and 4.80 eV, respectively, both of which are suitable for achieving a low threshold voltage. In this modification, the work function of the n-channel MIS transistor is 0.1 eV smaller than the work function of the gate electrode 16 made of NiSi of the second embodiment. Accordingly, an operation with an even lower threshold voltage can be performed.

Manufacturing Method in Accordance with First Modification of Second Embodiment

Referring now to FIGS. 14 through 17, a method for manufacturing the semiconductor device of this modification shown in FIG. 13 is described.

The NiSi layers 13 are selectively formed on the source and drain regions, and the interlayer insulating film 20 is deposited. The upper ends of the SiN layers 18 are exposed by CMP, as shown in FIG. 9. Those procedures are the same as the corresponding procedures by the manufacturing method in accordance with the second embodiment.

Figure 14:
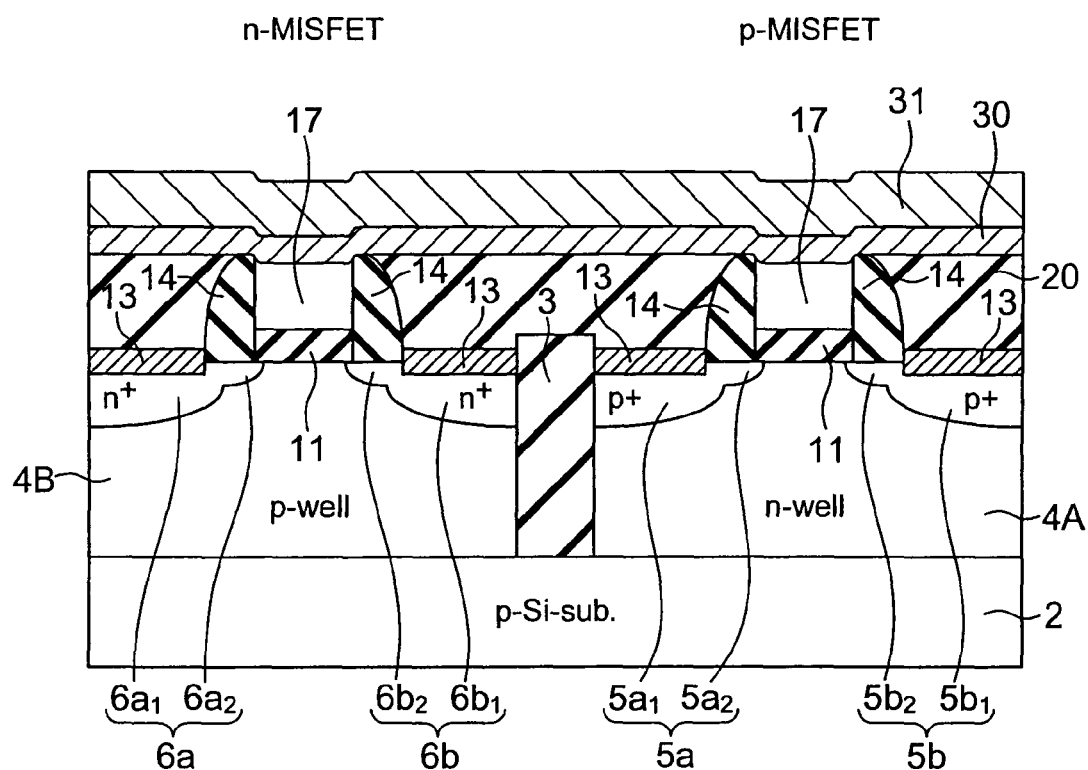
FIGS. 14 through 16 are cross-sectional views illustrating the procedures for manufacturing the CMISFET according to the first modification of the second embodiment.
Figure 15:
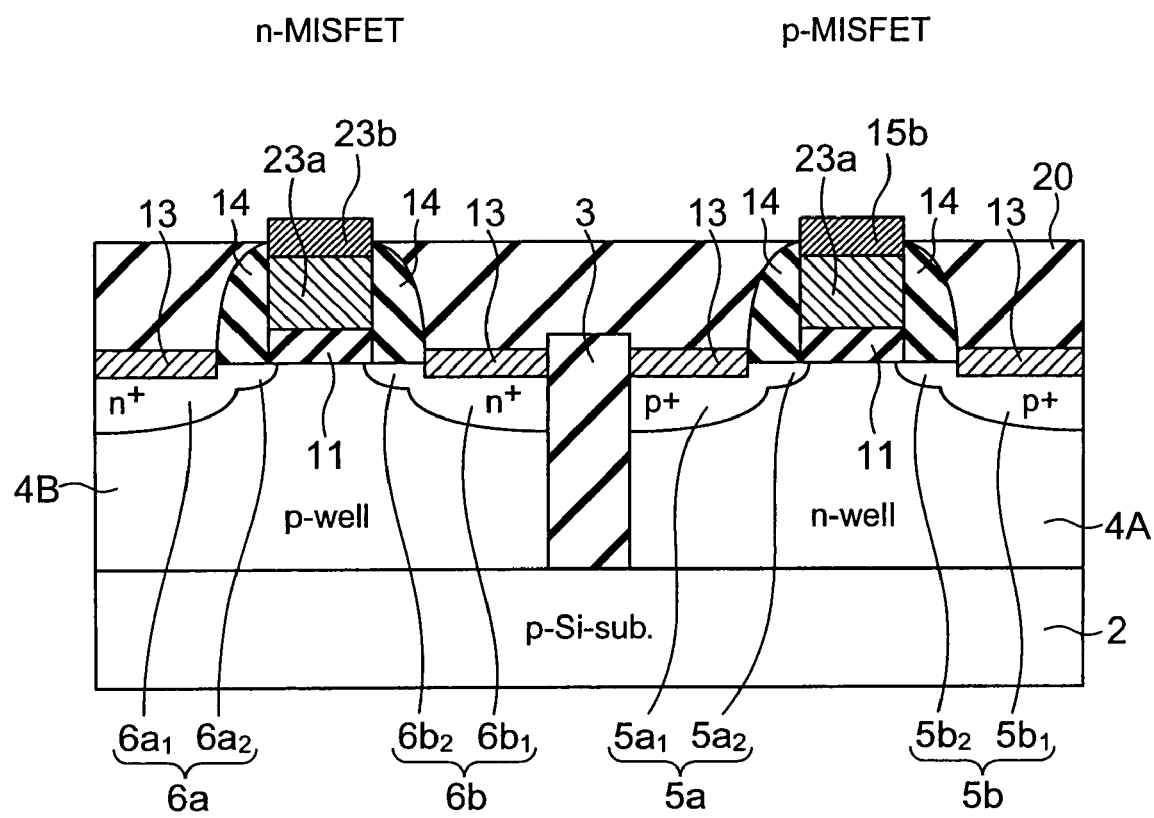

After the SiN layers 18 on the polycrystalline silicon electrodes are removed, the natural oxide film on each polycrystalline silicon layer 17 is removed by surface treatment such as diluted hydrofluoric acid treatment. The 5-nm thick Ti film 30 and the 12-nm thick Ni film 31 are then formed by a sputtering technique (FIG. 14). Low-temperature heat treatment is then carried out at 500° C., so that the polycrystalline silicon layers 17 of both conductivity types turn into stacked structures formed with 29-nm thick $NiSi_2$ layers 23a and 10-nm thick $TiSi_2$ layers 15b and 23b (FIG. 15). This reaction utilizes the fact that a Si-rich region is formed at the interface as the diffusion rate of Ni into Si is restrained, and a $NiSi_2$ phase that can be formed only through high-temperature heat treatment at 650° C. or higher is formed as a solid-phase reaction caused at the interface between the Ni film and the Si. If the natural oxide film on each of the polycrystalline silicon layers 17 is thoroughly removed before the interfacial reaction, the $TiSi_2$ layers 15b and 23b that do not contain oxygen are formed on the gate electrodes. If the removal of the natural oxide film is not thorough, a Ti silicide layer containing a large amount of oxygen in a $TiSi_2$ phase, or a Ti silicide layer of a TiSiO phase or a $TiO_2$ phase might be formed. In a case where any of those layers is formed, the layer does not affect the transistor characteristics. The unreacted Ni and Ti are then removed by acid solution treatment.

Figure 16:
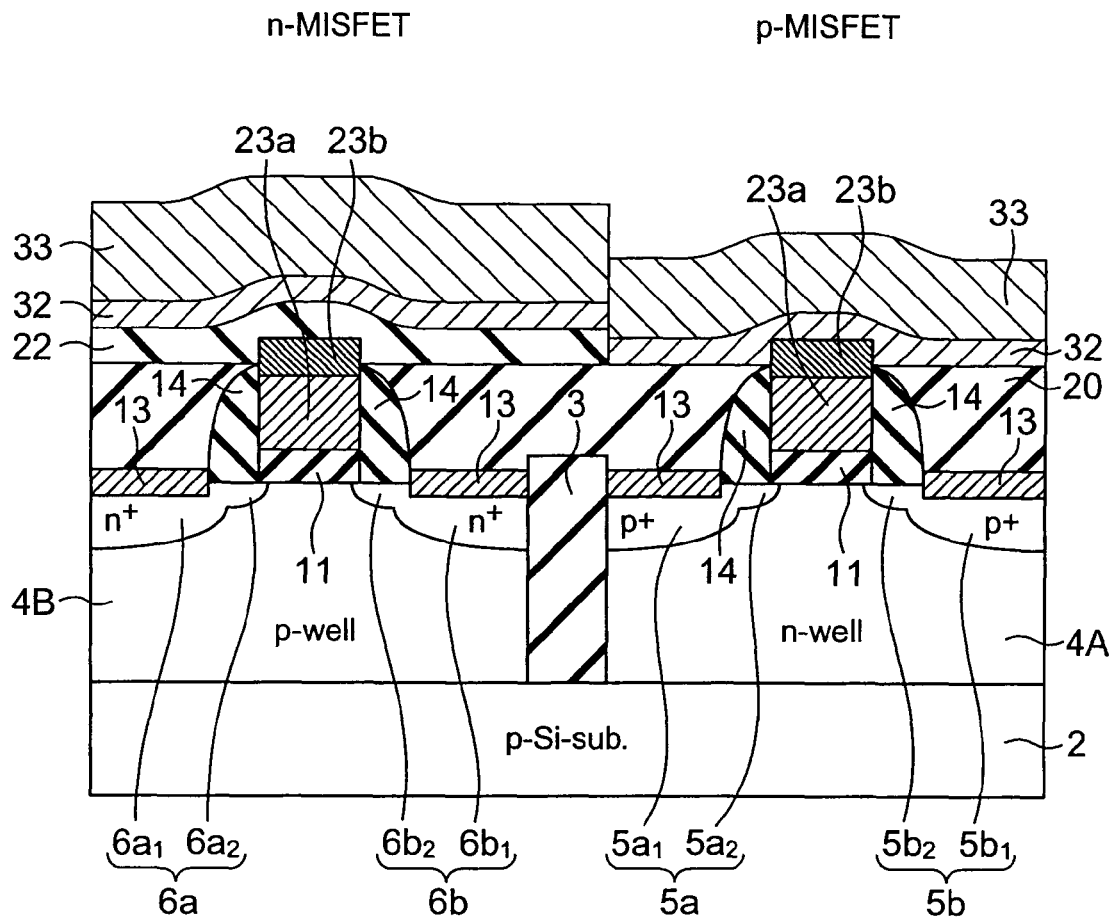

After only the n-channel MIS transistor region is protected with a $SiO_2$ or SiN film 22, a 3-nm thick Ti film 32 and a 31-nm thick Ni film 33 are continuously formed by a sputtering technique, and low-temperature heat treatment is carried out at 500° C. (FIG. 16). Through the low-temperature heat treatment, only the $NiSi_2$ layer 23a of the p-channel MIS transistor region turns into the Ni silicide layer 15a of a $Ni_3Si$ phase. This reaction is caused because the highly-reducible Ti film is inserted at the interface between the Ni film and the NiSi layer, so as to facilitate the interfacial reaction at the interface, as described in the description of the manufacturing method in accordance with the first embodiment. After that, the unreacted Ni and Ti are removed by acid solution treatment, and the SiN film 22 is removed from the n-channel MIS transistor region, so as to obtain the CMISFET of this modification shown in FIG. 13. By this manufacturing method, the thicknesses of the Ti and Ni to be reacted with the polycrystalline silicon layers 17 are the same as those in the second embodiment. Accordingly, the height of the gate electrode of the p-channel MIS transistor is 68.9 nm as in the structure shown in FIG. 6. Meanwhile, the gate electrode of the n-channel MIS transistor becomes a stacked structure consisting of a 29-nm thick Ni silicide layer 23a of a $NiSi_2$ phase and a 12-nm thick $TiSi_2$ layer 23b. Accordingly, in this modification, the gate height of the gate electrode 15 is 1.68 (68.9/(29+12)) times greater than the gate height of the gate electrode 23. Normally, the ratio between the heights of a $NiSi_2$ gate electrode and a $Ni_3Si$ gate electrode is approximately 2.36 (=94.5/40) in a case where polycrystalline silicon films of the same thickness are used. In this modification, however, the layer thickness (16 nm) of the $TiSi_2$ layer of the p-channel MIS transistor is greater than the thickness (10 nm) of the corresponding layer of the n-channel MIS transistor, and only the $TiSi_2$ layer of the p-channel MIS transistor can be made thicker. Thus, the difference in gate height can be made even smaller.

In this modification, the film thickness of the Ti film is 5 nm at the time of the formation of a $NiSi_2$ phase in each of the n-channel and p-channel MIS transistors. However, the insertion of a 1-nm thick Ti film is effective enough for forming a $NiSi_2$ phase at a low temperature. Therefore, the film thickness of each Ti film is at least 1 nm. Only the film thickness of the Ti film in the p-channel MIS transistor is increased at the time of the formation of the Ti film and the Ni film, so that the difference in height becomes even smaller.

Second Modification of Second Embodiment

Figure 17:
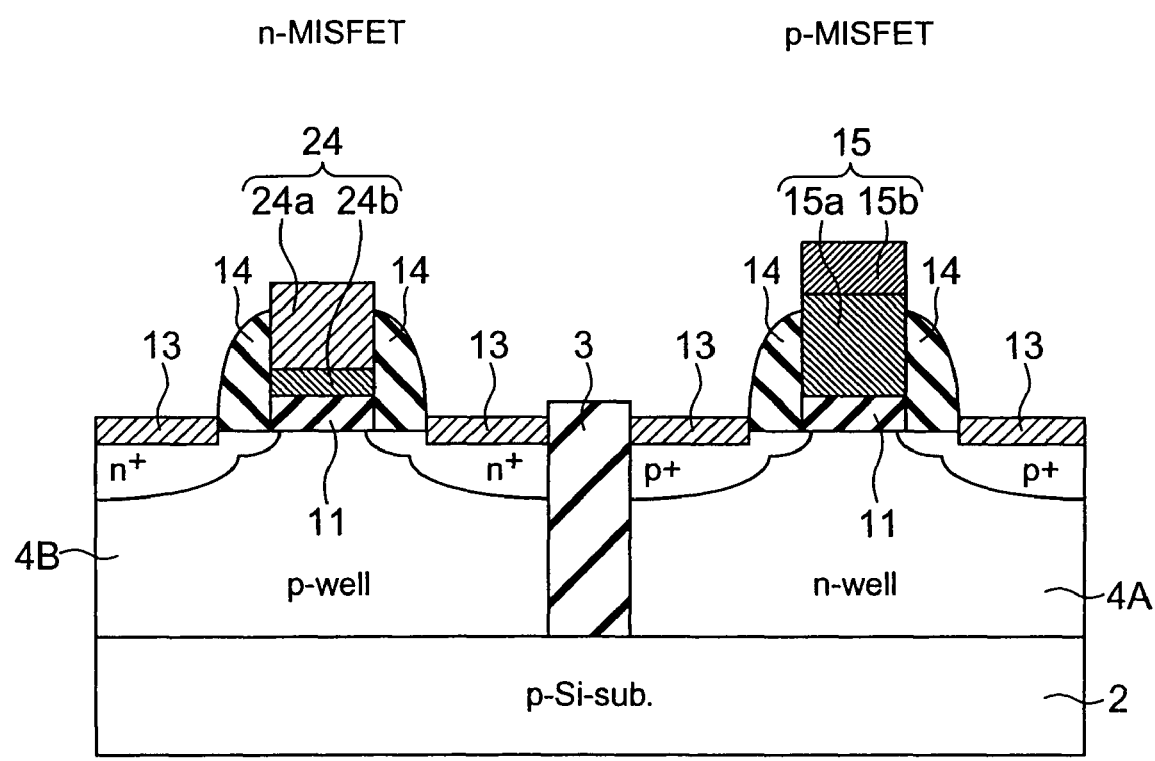
FIG. 17 is a cross-sectional view of a CMISFET according to a second modification of the second embodiment, taken along the line extending in the gate length direction.

Referring now to FIG. 17, a CMISFET in accordance with a second modification of the second embodiment is described. FIG. 17 is a cross-sectional view of the CMISFET of this modification, taken along a line extending in the gate length direction of the CMISFET.

As shown in FIG. 17, the CMISFET of this modification has the same structure as the CMISFET of the second embodiment shown in FIG. 8, except that the gate electrode 16 of the n-channel MIS transistor is replaced with a gate electrode 24 having a stacked structure consisting of an Al layer 24a as the lower layer and a $Ni_2Si$ layer 24b as the upper layer.

As in the second embodiment, the gate electrode structure of this modification is designed to have different effective work functions Φeff so as to optimize each threshold voltage in accordance with the conductivity type. In the n-channel MIS transistor, the gate electrode in contact with the gate insulating film 11 is the Al layer 24a. In the p-channel MIS transistor, the gate electrode in contact with the gate insulating film is the $Ni_3Si$ layer 15a. The effective work functions Φeff of those layers are 4.27 eV and 4.80 eV, respectively, both of which are suitable for achieving a low threshold voltage. In this modification, the work function of the n-channel MIS transistor is approximately 0.2 eV smaller than the work function of the gate electrode 16 made of NiSi of the second embodiment, and the work function of the n-channel MIS transistor is approximately 0.1 eV smaller than the work function of the gate electrode made of NiSi$_2$ of the first modification. Accordingly, an operation with an even lower threshold voltage can be performed.

Here, if one atomic layer (or monolayer) of aluminum is formed continuously in the in-plane direction at the interface between the Ni$_2$Si layer 24a and the gate insulating film 11 made of HfSiON, the work function of the aluminum layer becomes effective, and the threshold voltage Vth of the n-channel MIS transistor becomes lower. However, if there are broken portions in the aluminum atomic layer in the in-plane direction, the work function of those portions is determined by the properties of Ni$_2$Si. As a result, the threshold voltage Vth varies among transistors, and a variation in characteristics might be caused. Therefore, the thickness of the interface aluminum layer of this embodiment is one atomic layer or more in principle. However, with a characteristics variation due to incomplete processing being taken into consideration, the thickness of the interface aluminum layer should preferably be 3 atomic layers or more. An aluminum layer of 3 atomic layers or more does not hinder the effect of reducing the threshold voltage Vth, but segregation of the excess aluminum at the interface is a waste.

Figure 18:
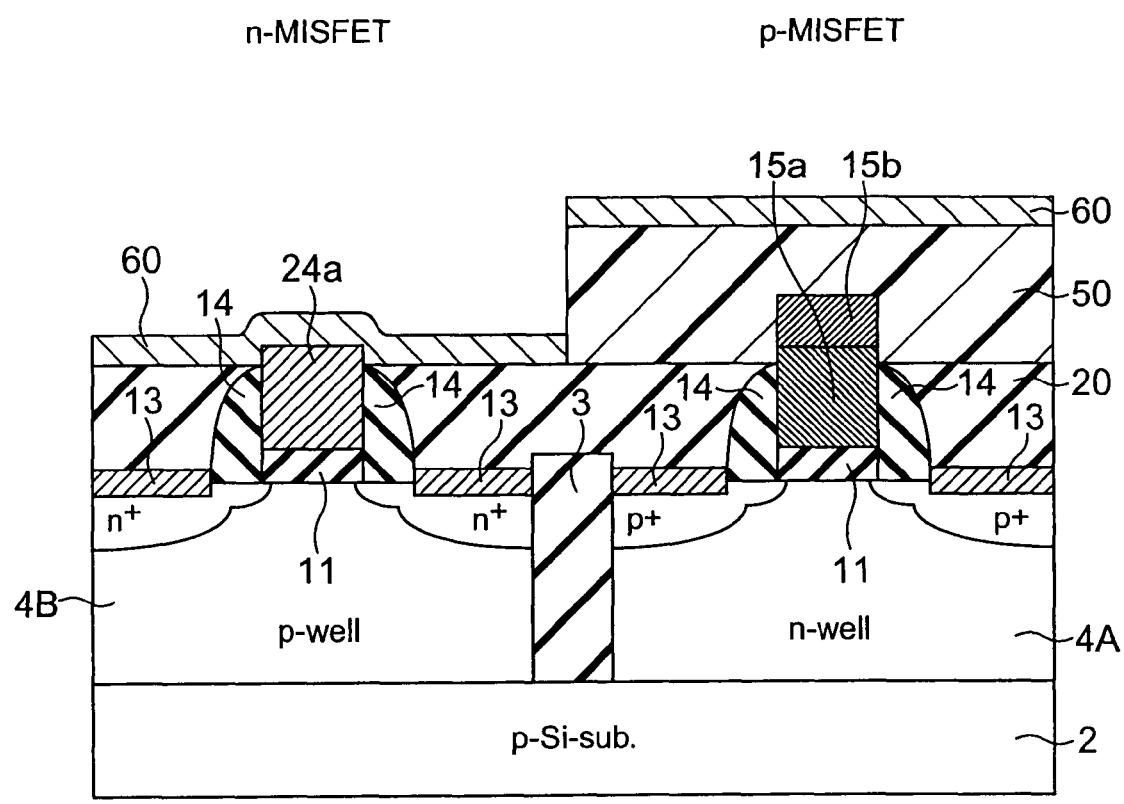
FIG. 18 is a cross-sectional view illustrating the procedures for manufacturing the CMISFET according to the second modification of the second embodiment.

The difference between the manufacturing method in accordance with this modification and the manufacturing method in accordance with the second embodiment is that the film thickness of the Ni film formed by a sputtering technique at the time of the formation of the NiSi layers 19 shown in FIG. 10 is adjusted to 40 nm so as to form gate electrodes formed with Ni$_2$Si layers for both conductivity types. As described with reference to FIG. 11, the n-channel MIS transistor region is covered with a mask made of SiN, for example, and a 8-nm thick Ti film and a 30-nm thick Ni film are stacked one by one. In this manner, only the gate electrode of the p-channel MIS transistor is turned into a stacked structure of the Ni$_3$Si layer 15a and the TiSi$_2$ layer 15b. After the mask is removed, the p-channel MIS transistor region is covered with a mask, resist 50, for example, and only the n-channel MIS transistor region remains exposed. In this situation, a 30-nm thick Al film 60 is formed on the gate electrode formed with the Ni$_2$Si layer 24a, as shown in FIG. 18. Heat treatment is then carried out at 450° C., so as to segregate Al at the interface between the gate electrode and the gate insulating film 11. In this manner, the Al layer 24a is formed. The Al film 60 remaining on the upper surface is removed, so as to obtain the CMISFET of this modification shown in FIG. 17. The addition of Al may be performed not by forming an Al film but by implanting Al ions.

In this modification, the gate height of the gate electrode 15 is 68.9 nm, and the gate height of the gate electrode 24 is 59 nm, which are the same as those of the second embodiment. Accordingly, the gate height of the gate electrode 15 is 1.16 times greater than the gate height of the gate electrode 24.

Third Modification of Second Embodiment

Figure 19:
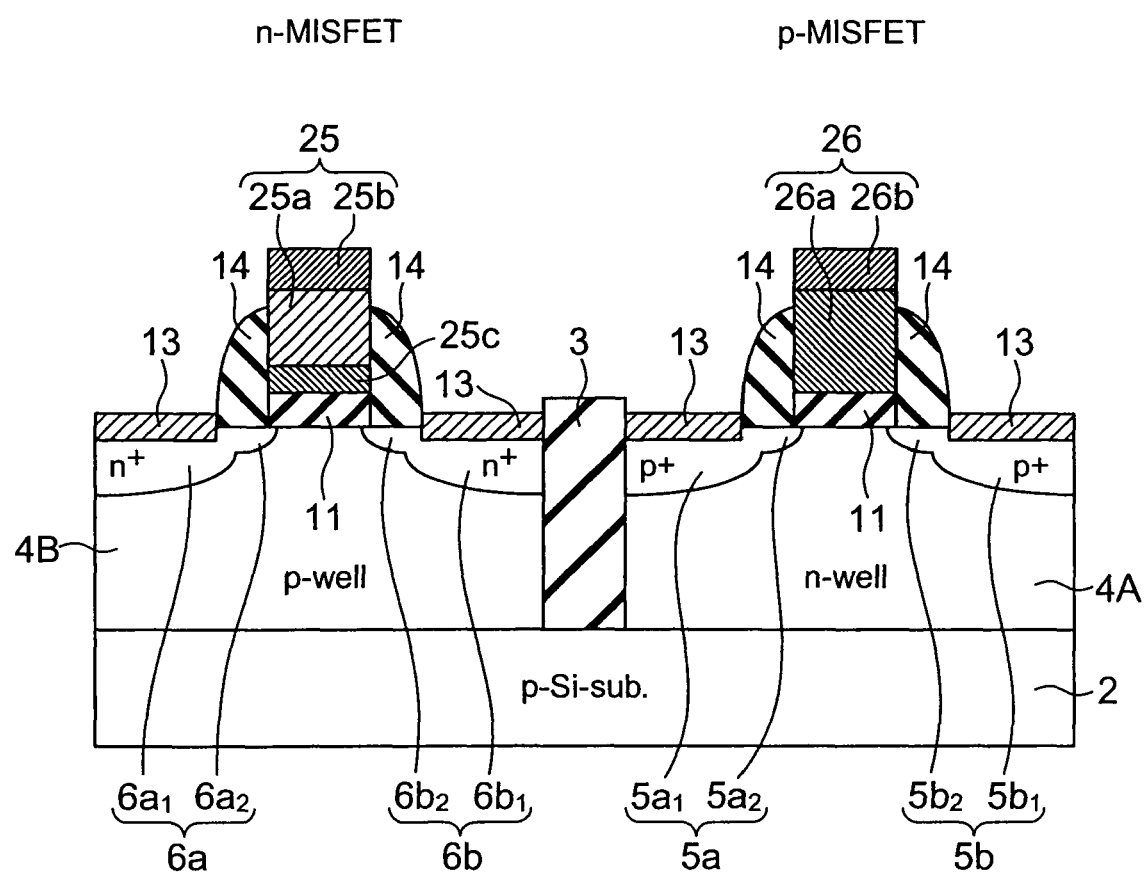
FIGS. 19 through 21 are cross-sectional views illustrating the procedures for manufacturing the CMISFET according to a third modification of the second embodiment.

Referring now to FIG. 19, a CMISFET in accordance with a third modification of the second embodiment is described. FIG. 19 is a cross-sectional view of the CMISFET of this modification, taken along a line extending in the gate length direction of the CMISFET.

As shown in FIG. 19, the CMISFET of this modification has the same structure as the CMISFET of the second embodiment shown in FIG. 8, except that the gate electrode 16 of the n-channel MIS transistor is replaced with a gate electrode 25 having a stacked structure consisting of an Al layer 25c as the lower layer, a Ni$_2$Si layer 25a formed immediately above the Al layer 25c, and a TiSi$_2$ layer 25b as the uppermost layer, and the gate electrode 15 of the p-channel MIS transistor is replaced with a gate electrode 26 having a stacked structure consisting of a Ni$_2$Si layer 26a as the lower layer and a TiSi$_2$ layer 26b as the upper layer.

As in the second embodiment, the gate electrode structure of this modification is designed to have different effective work functions Φeff so as to optimize each threshold voltage in accordance with the conductivity type. In the n-channel MIS transistor, the gate electrode in contact with the gate insulating film 11 is the Al layer 25c. In the p-channel MIS transistor, the gate electrode in contact with the gate insulating film 11 is the Ni$_2$Si layer 26a. The effective work functions Φeff of those layers are 4.27 eV and 4.7 eV, respectively, both of which are suitable for achieving a low threshold voltage. In this modification, the work function of the gate electrode of the n-channel MIS transistor is approximately 0.2 eV smaller than the work function of the gate electrode made of NiSi of the second embodiment, and the work function of the gate electrode of the n-channel MIS transistor is approximately 0.1 eV smaller than the work function of the gate electrode made of NiSi$_2$ of the first modification. Accordingly, an operation with an even lower threshold voltage can be performed.

Figure 20:
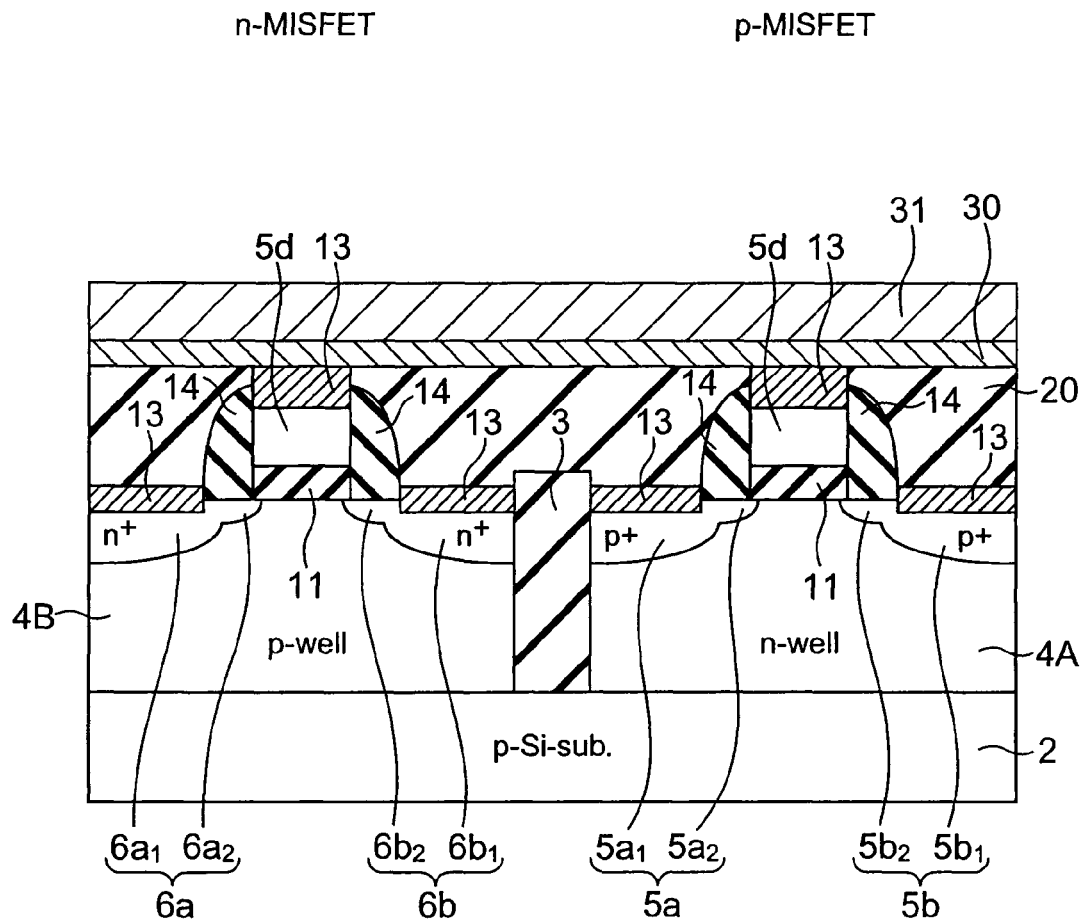
Figure 21:
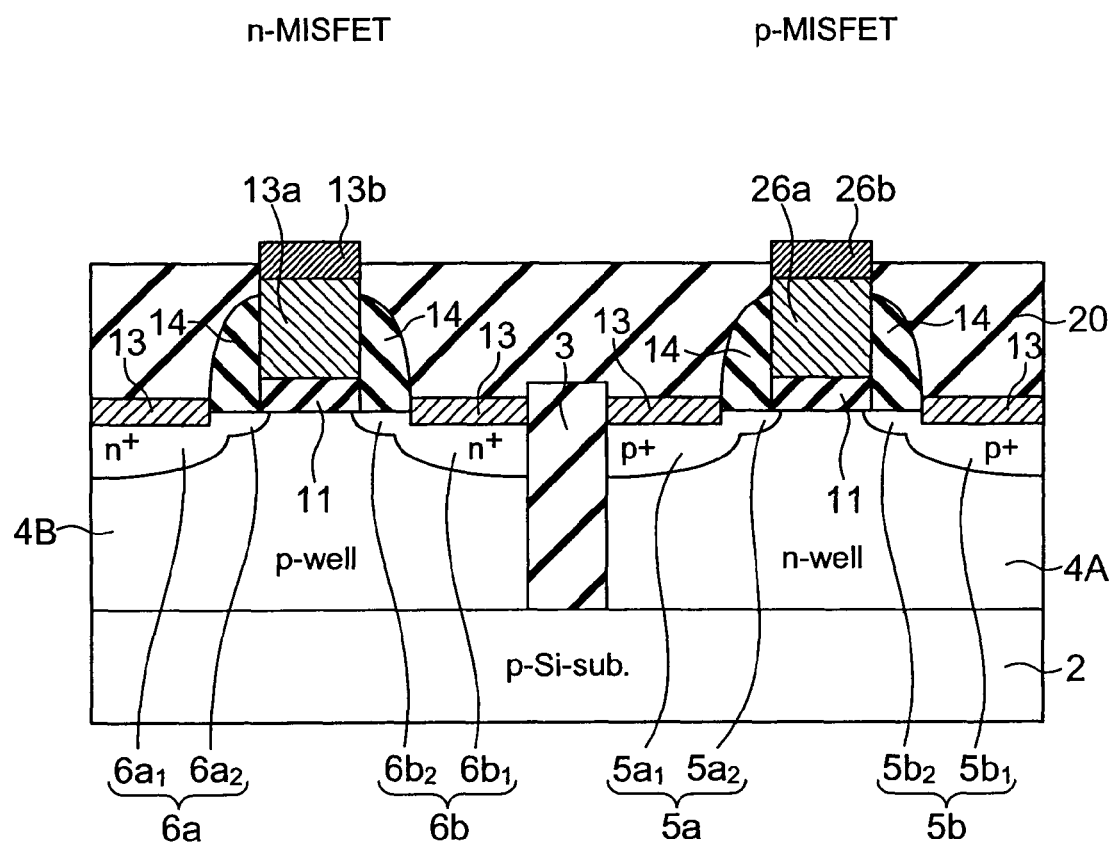

Referring now to FIGS. 20 and 21, a manufacturing method in accordance with this embodiment is described. The manufacturing method in accordance with the first embodiment is applied to both of the n-channel MIS transistor and the p-channel MIS transistor, so that the NiSi layers 13 are formed on the polycrystalline silicon layers 5d, the source regions 5a and 6a, and the drain regions 5b and 6b (FIG. 20). After that, the interlayer insulating film 20 is deposited by low-pressure CVD, and the upper faces of the NiSi layers 13 on the polycrystalline silicon layers 5d are exposed by CMP (FIG. 20). After the natural oxide film on the NiSi layers 13 are removed by surface treatment such as diluted hydrofluoric acid treatment, a 5-nm thick Ti film 30 and a 30-nm thick Ni film 31 are formed on the entire surface. Heat treatment is then carried out at 500° C. for one minute, so that the gate electrode having the stacked structure of the Ni$_2$Si layer 25a and the TiSi$_2$ layer 25b is formed in the n-channel MIS transistor region, and the gate electrode having the stacked structure of the Ni$_2$Si layer 26a and the TiSi$_2$ layer 26b is formed in the p-channel MIS transistor region (FIG. 21).

After that, Al is introduced into the interface with the gate insulating film 11 in the n-channel MIS transistor, so as to form the Al layer 25c, as in the second modification. In this manner, the CMISFET of this modification shown in FIG. 19 can be obtained. In this modification, the gate electrode 26 and the gate electrode 25 have substantially the same gate heights.

In this modification, the lower electrode of the p-channel MIS transistor is the Ni$_2$Si layer 26a, which has a smaller work function than the Ni$_3$Si layer 15a of the second modification shown in FIG. 17. Accordingly, the operating voltage of the p-channel MIS transistor becomes higher. In combination with the channel technique described earlier, an even lower threshold voltage can be achieved.

In the first embodiment, the second embodiment, and the modifications of those embodiments, the Ni silicide layer of the gate electrode of the p-channel MIS transistor is a Ni$_3$Si phase or a Ni$_2$Si phase. However, a silicide layer of a Ni$_{31}$Si$_{12}$ phase may also be employed. This is because the effective work function of a silicide layer of a Ni$_{31}$Si$_{12}$ phase is 4.8 eV.

Accordingly, nickel silicide having a Ni/Si composition ratio of 2 or higher can be used as the Ni silicide layer of the p-channel MIS transistor.

As described above, each of the embodiments of the present invention can provide a semiconductor device including MIS transistors that have a smaller variation during the manufacturing process and have appropriate threshold voltages, and a method for manufacturing such a semiconductor device.

Although the embodiments of the present invention have been described so far, the present invention is not limited to those embodiments, and various changes may be made to them within the scope of the claimed invention. Also, those embodiments of the invention may be arbitrarily modified without departing from the scope of the invention. Further, the components disclosed in those embodiments may be arbitrarily combined to form various modifications.

What is claimed is:

1. A semiconductor device comprising:
    a substrate; and
    a p-channel MIS transistor including:
        an n-type semiconductor region formed in the substrate;
        p-type first source and drain regions formed at a distance from each other in the n-type semiconductor region;
        a first gate insulating film formed on the n-type semiconductor region between the first source region and the first drain region; and
        a first gate electrode formed on the first gate insulating film, the first gate electrode including
            a first nickel silicide layer having a Ni/Si composition ratio of 1 or greater, and
            a silicide layer formed on the first nickel silicide layer, the silicide layer containing a metal and an oxygen, the metal having a larger absolute value of oxide formation energy than that of Si, a composition ratio of the metal to Si being smaller than the Ni/Si composition ratio.

2. The device according to claim 1, wherein the first nickel silicide layer has a Ni/Si composition ratio of 2 or greater.

3. The device according to claim 1, wherein the metal is at least one metal selected from Ti, Hf, and Zr.

4. The device according to claim 1, wherein the silicide layer containing the metal is 2 nm or greater in thickness, and the first nickel silicide layer is 5 nm or greater in thickness.

5. The device according to claim 1, further comprising:
    an n-channel MIS transistor including:
        a p-type semiconductor region formed in the substrate and insulated from the n-type semiconductor region;
        n-type second source and drain regions formed at a distance from each other in the p-type semiconductor region;
        a second gate insulating film formed on the p-type semiconductor region between the second source region and the second drain region; and
        a second gate electrode formed on the second gate insulating film, and including a second nickel silicide layer having a smaller Ni/Si composition ratio than that of the first nickel silicide layer.

6. The device according to claim 5, wherein the first nickel silicide layer has a Ni/Si composition ratio of 2 or greater.

7. The device according to claim 5, wherein the metal is at least one metal selected from Ti, Hf, and Zr.

8. The device according to claim 5, wherein the second gate electrode includes a titanium silicide layer on the second nickel silicide layer, and the silicide layer containing the metal is a titanium silicide layer.

9. The device according to claim 5, wherein the first gate electrode has a height equal to or smaller than a value 2.36 times the height of the second gate electrode.

10. The device according to claim 1, further comprising:
    an n-channel MIS transistor including:
        a p-type semiconductor region formed in the substrate and insulated from the n-type semiconductor region;
        n-type second source and drain regions formed at a distance from each other in the p-type semiconductor region;
        a second gate insulating film formed on the p-type semiconductor region between the second source region and the second drain region; and
        a second gate electrode formed on the second gate insulating film, the second gate electrode including
            a second nickel silicide layer having the same composition ratio as that of the first nickel silicide layer or a smaller Ni/Si composition ratio than that of the first nickel silicide layer, and
            an Al layer formed at the interface between the second nickel silicide layer and the second gate insulating film.

11. The device according to claim 10, wherein the second gate electrode includes a titanium silicide layer on the second nickel silicide layer, and the silicide layer containing the metal is a titanium silicide layer.

12. The device according to claim 1, wherein the first gate insulating film includes any one of HfSiON, $Al_2O_3$, $HfO_2$, LaAl oxide, and LaHf oxide.

13. The device according to claim 1, wherein the silicide layer comprises a metal oxide phase or a metal oxide layer.

* * * * *